(12) United States Patent
Kudo et al.

(10) Patent No.: US 6,448,666 B1
(45) Date of Patent: Sep. 10, 2002

(54) SEMICONDUCTOR DEVICE AND METHOD FOR FORMING INSULATING FILM

(75) Inventors: Hiroshi Kudo; Rika Shinohara, both of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/389,009

(22) Filed: Sep. 2, 1999

Related U.S. Application Data

(62) Division of application No. 08/597,879, filed on Feb. 7, 1996.

(30) Foreign Application Priority Data

| Feb. 17, 1995 | (JP) | 7-029137 |
| May 15, 1995 | (JP) | 7-115580 |
| Jan. 9, 1996 | (JP) | 8-001201 |

(51) Int. Cl.$^7$ ............................................. H01K 21/00
(52) U.S. Cl. .................................................. 257/798
(58) Field of Search ........................ 438/778, 779–794, 438/758, 784, 763, 798

(56) References Cited

U.S. PATENT DOCUMENTS

| 4,803,366 A | 2/1989 | Vieux et al. |
| 5,040,046 A | 8/1991 | Chhabra et al. |
| 5,629,246 A | 5/1997 | Iyer |

FOREIGN PATENT DOCUMENTS

| JP | 6-140386 | 5/1994 |
| JP | 6-240459 | 8/1994 |
| KR | 91-17554 | 5/1991 |
| KR | 94-12488 | 6/1994 |

OTHER PUBLICATIONS (Inscpec Absctract B9306–520F–027) "A room temp. chemical vapor deposition SiOF film formation tech. for the interlayer in submicron multilevel interconnections." Homma, T; Yamaguchi, R.; Murao Y. J. of the Electrochemical Soc. vol. 140, No. 3, pp687–92.*

H. Kudo, S. Takeishi, N. Awaji, and M. Yamamada. "Densified SiOF Film Formation for Preventing Water Absorption." Ext. Abstr. 1995 Int. Conf. Solid State Devices and Materials, Osaka, 1995. pp. 605–607. Business Center for Academic Societies, Tokyo, Jap.*

H. Kudo, R. Shinohara, S. Takeishi, N. Awaji, and M. Yamamada.Densified SiOF Film Formation for Preventing Water Absorption. Japanese Journal of Applied Physics vol. 35 (1996) pp 1583–1587 Part 1. No. 2b. Feb. 1996.*

M. Yoshimaru, S. Koizumi and K. Shimokawa "Structure of Fluorine–Doped Silicon Oxide Films Deposited by Plasma–Enhanced Chemical Vapor Deposition" J. Va Sci. Technol. A. (15) 6 pages 2908–2914.

(List continued on next page.)

*Primary Examiner*—Charles Bowers
*Assistant Examiner*—Craig Thompson
(74) *Attorney, Agent, or Firm*—Armstrong, Westerman & Hattori, LLP

(57) ABSTRACT

The present invention relates to a method for forming an insulating film with a low relative dielectric constant. A method for forming an insulating film in terms of a plasma chemical vapor deposition, characterized in that a Si supply gas, an oxygen supply gas, and a fluorine supply gas are used a material gas to form said insulating film, and said insulating film is formed under a film forming condition that a density of said insulating film to be formed is equal to or more than 2.25 g/cm$^3$.

1 Claim, 31 Drawing Sheets

OTHER PUBLICATIONS

M. Yoshimaru, S. Koizumi and K. Shimokawa "Interaction between Water and Fuorine–Doped Silicon Oxide Films Deposited by Plasma–Enhanced Chemical Vapor Deposition" J.Va Sci. Technol. A. (15) 6 pages 2915–2922.

Sang M. Han and Eray S. Aydil "Structure and Chemical Deposition of Fluorinated SiO2 Films Deposited using SiF4/O2 Plasmas" J. Vac. Sci. Technol. A 15(6) pages 2893–2903.

Seoghyeong Lee and Jong–Wan Park "Effect of Fluorine on Dielectric Properties of SiOF Films." J. Applied Physics. 80(0) pages 5260–5263.

Takashi Fukuda et al., "Preparation of SiOF Films with Low Dielectric Constant by ECR Plasma Chemical Vapor Deposition", Extended Abstracts of the 1993 International Conference on Solid State Devices and Materials, Makuhari, 1993, pp. 158–160.

Takashi Usami et al., "Low Dielectric Constant Interlayer Using Fluorine Doped Silicon Oxide", Extended Abstracts of the 1993 International Conference on Solid State Devices and Material, Makuhari, 1993, pp. 161–163.

Kazuhiko Endo et al., "Preparation and Properties of Fluorinated Amorphous Carbon Thin Films by Plasma Enhanced Chemical Vapor Deposition", Materials Research Society, symposium proceedings, vol. 381, Low–dielectric Constant Materials–Synthesis and Applications in Microelectronics, 1995, pp. 249–254.

Kazuhiko Endo et al., "Nitrogen Doped Fluorinated Amorphous Carbon Thin Films Grown by Plasma Enhanced Chemical Vapor Deposition", Extended Abstracts of the 1995 International Conferences on Solid State devices and Materials, Osaka, 1995, pp. 177–179.

* cited by examiner

SEMICONDUCTOR DEVICE AND METHOD FOR FORMING INSULATING FILM

This application is a divisional of Ser. No. 08,597,879 filed Feb. 7, 1996.

BACKGROUND OF THE INVENTION

1. Field of the Invention

The present invention relates to a method for forming an insulating film and a semiconductor device and, more particularly, a method for forming an insulating film used as an interlayer insulating film of a high integration density semiconductor integrated circuit device and having a low relative dielectric constant and a semiconductor device employing the insulating film therein.

2. Description of the Prior Art

In recent, reconsideration of interlayer insulating films for use in multilayered interconnections has been effected from a view point of high integration density or high speed operation of semiconductor integrated circuit devices.

More particularly, from view points of stability, easiness of film forming, etc., an $SiO_2$ film has been widely used as an interlayer insulating film of the semiconductor integrated circuit device. But the problem of increase in parasitic capacitance has arisen according to progress of recent miniaturization of the circuit.

Conventionally, a low temperature film forming method has been used in forming the interlayer insulating film when taking influence on aluminum interconnection layers, etc. into consideration. For instance, the methods for forming the $SiO_2$ film employing a plasma chemical vapor deposition method (referred to as PCVD method hereinafter) using tetraethylorthosilicate (referred to as TEOS hereinafter), i.e., $(C_2H_5O)_4Si$ have been proposed (see Patent Application Publication (KOKAI) 6-240459 and Patent Application Publication (KOKAI) 6-140386).

In the former (Patent Application Publication (KOKAI) 6-240459), when the $SiO_2$ film is formed in the course of manufacturing a polysilicon thin film transistor (poly-SiTFT) which is used in view finder being requested to have a large area over 300 mm, CCD, liquid crystal projector and the like, the ratio of the flow rate of $O_2$ gas or mixed gas of $O_2$ and He to TEOS is set at more than 50 times. Impurities cannot stay even in the center of the large area substrate, and can therefore be removed from a surface of a substrate in the course of manufacturing to thus result in uniform film quality.

However, in the foregoing forming method of the $SiO_2$ film, step coverage of the interlayer insulating film is lowered because of wiring steps. As a result, the foregoing forming method of the $SiO_2$ film is not suitable for forming the interlayer insulating film of monolithic semiconductor integrated circuit such as memory, logic circuit, and the like.

In the latter (Patent Application Publication (KOKAI) 6-140386), it has been intended to reduce humidity absorption which causes degradation of device characteristics. The ratio of the flow rate of $O_2$ to TEOS has been set at about 2.2 times, i.e., the flow rate of $O_2$ has been set at 730 cc/min in contrast to the flow rate of TEOS of 330 cc/min.

However, since the $SiO_2$ film formed by the PCVD method has high relative dielectric constant such as about 4.1, parasitic capacitance between interconnection layers is relatively large. When distances between interconnection layers are narrowed according to the progress in miniaturization of the circuit, parasitic capacitance has been further increased. This parasitic capacitance causes signal propagation delay, so an operation speed cannot be improved not to respond to miniaturization of the devices.

In other words, if relative dielectric constant of the interlayer insulating film is k and resistance of the interconnection layer is R, wiring delay time τ caused by the interconnection layers is in proportion to kR. Accordingly, it would be understood that material having small relative dielectric constant may be used as the interlayer insulating film to improve the wiring delay time. Parasitic capacitance can be reduced according to reduction in relative dielectric constant to thus decrease signal propagation delay.

Recently, as a method for forming an insulating film with low relative dielectric constant, several methods for forming the $SiO_2$ film including fluorine, i.e., SiOF film by adding fluorine contained gas into material gas in terms of the PCVD method have been reported (see Fukada, Akahori, Extended Abstracts of the 1993 International Conference on Solid State Devices and Materials, Makuhari, 1993, pp.158–160; Usami, Shimokawa, Yoshimura, Extended Abstracts of the same, pp.161–163; and Mizuno, Hara et al., Extended Abstracts of the same, pp.510–512). The SiOF film is worthwhile to be used as interlayer insulating film of the next generation semiconductor integrated circuit device since its relative dielectric constant is lower than 4.1 in the conventional $SiO_2$.

However, the SiOF film has unstable relative dielectric constant because of its high humidity absorption, like the $SiO_2$ film formed by the PCVD method. In other words, if the SiOF film having low relative dielectric constant can be formed at first, the relative dielectric constant is increased as time elapsed. This is because water component absorbed into the SiOF film has significantly high relative dielectric constant like 80. Such water absorption into the SiOF film has resulted in not only increase in the relative dielectric constant but also bad influence on the semiconductor device per se, so that reliability of the semiconductor device is lessened.

Currently, as the insulating film having lower relative dielectric constant than the above insulating film, the insulating film formed of fluorine macromolecule has been known in the art. For example, relative dielectric constant of polytetrafluoroethylene (P-TFE) is 2.2 (1 MHz). Since the value is smallest in organic materials, P-TFE is promising as the insulating film.

However, since fluorine macromolecule is in general insoluble into most solvents, they cannot be treated by spin coating or press coating as in ordinary photosensitive resins. So they have such drawbacks that it is difficult to form thin films by fluorine macromolecule.

In addition, although some of fluorine macromolecule materials which can be treated by spin coating are in market as a merchandise, they have poor adhesiveness and heat resistance. As a result, they have such drawbacks that decomposition or exfoliation from the substrate occurs in heating the substrate.

Besides, to overcome the problem of such adhesiveness, there are some reports wherein P-TFE thin film has been formed by plasma polymerization. However, the plasma polymerization film can provide good adhesiveness, but it has the drawback that heat resistance is poor. Furthermore, since polymer of low molecular weight is included into the film and released from the film when the substrate is heated, merely the film having relative dielectric constant such as about 2.7 (1 MHz) can be obtained.

For example, the following method has been proposed by Kazuhiko Endo and Toru Tatsumi. That is, using the parallel plate type plasma CVD equipment (CCP=Capacitive Coupled Plasma) and the helicon wave plasma CVD equipment, amorphous carbon fluoride film (fluorine type resin film) has been formed under the conditions that $CF_4$+$CH_4$ or $C_2F_6$+$CH_4$ is used as material gas and substrate temperature is at 50° C. (see Material Research Society, symposium proceedings, Vol.381, entitled Low-Dielectric Constant Materials-Synthesis and Applications in Microelectronics, 1995, pp.249 to 254).

According to this method, the fluorine type resin film enabling excellent heat resistance would be obtained by mixing $CH_4$ as the hydrogen containing compound into the film when forming the film. More specifically, in stacking the film, fluorine (F) radical serving as the basis of etching operation is gettered by hydrogen (H) to reduce its etching operation and at the same time to produce carbon rich state so as to enhance bridging density. The fluorine type resin film having relative dielectric constant of 2.1 could be obtained by the parallel plate type plasma CVD equipment, and also the fluorine type resin film having relative dielectric constant of 2.4 could be obtained by the helicon wave plasma CVD equipment.

However, there has been caused the problem that the relative dielectric constant is increased to 2.7 by annealing process at 300° C.

According to the film forming method excluding the film forming method using the helicon wave plasma CVD equipment and employing $C_2F_6$+$CH_4$ as material gas, there has been caused the problem that residual film rate is lessened less than 70% by annealing process at 300° C. for one hour to render heat resistance worse.

On the other hand, according to the film forming method using the helicon wave plasma CVD equipment and employing $C_2F_6$+$CH_4$ as material gas, residual film rate becomes 100% after annealing process at 300° C. for one hour, but residual film rate is lessened less than 60% by annealing process at 400° C.

Similarly, the following method has also been proposed by Kazuhiko Endo and Toru Tatsumi. That is, using the parallel plate type plasma CVD equipment and employing $CF_4$+$CH_4$ added by $N_2$ as material gas; amorphous carbon fluoride film (fluorine type resin film) has been formed at substrate temperature of 50° C. (see Extended Abstracts of the 1995 International Conference on Solid State Devices and Materials, Osaka, 1995, pp.177 to 179).

In this case, fluorine type resin film having relative dielectric constant of 2.5 could be obtained. The relative dielectric constant remains at 2.5 and is scarcely changed after annealing process at 300° C. for one hour, but there have been drawbacks that residual film rate is lessened less than 90% and in addition heat resistance becomes poor.

In two foregoing reports as for the amorphous carbon fluoride film (fluorine type resin film), annealing temperature denotes heater temperature. It may thus be supposed that actual temperature of the amorphous carbon fluoride film would be considerably lower than the heater temperature.

In the meanwhile, it can be supposed that characteristics which are required for the interlayer insulating film in the high integration density semiconductor device to be formed using a 0.18 $\mu$/m design rule are that the relative dielectric constant is less than 2.5 and residual film rate is almost 100% after heat treatment at more than 300° C.

However, these characteristics are difficult to be satisfied by the amorphous carbon fluoride film formed by the above two film forming methods.

SUMMARY OF THE INVENTION

It is an object of the present invention to obtain a PCVD-SiOF film which has stable characteristics and has low relative dielectric constant without applying low frequency power which affects transistor characteristics, from a view point specifying particular kinds of material gases and particular flow rate ratio.

It is another object of the present invention to obtain a PCVD-SiOF film which has excellent characteristics with good reproducibility by finding conditions permitting stable characteristics and lower relative dielectric constant from view points different from specifying particular kinds of material gases and particular flow rate ratio, on the basis of analysis of changing mechanism of relative dielectric constant in the PCVD-SiOF film.

It is still another object of the present invention to provide an interlayer insulating film formed of fluorine type resin film which has low relative dielectric constant, excellent heat resistance and can be formed as a thin film.

According to a method for forming an insulating film in terms of a plasma chemical vapor deposition method of the present invention, the PCVD-SiOF film which has stable characteristics and has low relative dielectric constant can be obtained by using tetraethylorthosilicate, oxygen and $C_2F_6$ as material gases, and setting a ratio of flow rate of oxygen gas to the tetraethylorthosilicate within a range between 20 or more and 40 or less.

The lower limit of the ratio of flow rate of 20 times is determined correspondingly to stability in a change with the passage of time. If the lower limit is less than 20 times, the change with the passage of time is enhanced even if the relative dielectric constant is small such as about 3.5 to 3.7 when being formed. There is no difference between this film and the conventional PCVD-$SiO_2$ film. The upper limit of the ratio of flow rate of 40 times is determined correspondingly to film forming rate in practical level and step coverage for wiring steps. If the upper limit exceeds 40 times, film forming rate is reduced and step coverage for wiring steps is degraded. So the range of 20 to 40 is preferable.

In addition, the PCVD-SiOF film which has less hydrophilicity, more stable characteristics and lower relative dielectric constant can be obtained by using tetraethylorthosilicate, oxygen and $C_2F_6$ as material gases, and setting a ratio of flow rate of $C_2F_6$ to the tetraethylorthosilicate within a range between 5 or more and 7 or less.

The lower limit of the flow rate ratio of 5 times is determined correspondingly to resultant dielectric constant. If the lower limit is less than 5 times, relative dielectric constant is more than 3.7 when the film is being formed and it is more than 3.8 if a change with the passage of time thereafter is considered. Therefore, advantage of preventing signal propagation delay is lessened.

The upper limit of the flow rate ratio of 7 times is determined correspondingly to stability in a change with the passage of time. If the upper limit is more than 7 times, for example, 8 times, relative dielectric constant is very low such as 3.5 when the film is being formed. But the relative dielectric constant is increased to about 4 after several days. There is no difference between this film and the conventional PCVD-$SiO_2$ film.

In the foregoing description, the excellent PCVD-SiOF film has been obtained by specifying material gases and manufacturing conditions. But by analyzing from another view point, i.e., from relation to characteristics of the PCVD-SiOF film, the invention in the following has been derived.

According to another method for forming an insulating film in terms of a plasma chemical vapor deposition method of the present invention, the PCVD-SiOF film which has stable characteristics can be obtained by using Si supply gas (33, 16 in FIG. 12), oxygen supply gas (13, 27 in FIG. 12) and fluorine supply gas (10, 30, 36 in FIG. 12) as material gases to form the insulating film having density of more than 2.25 $g/cm^3$.

In other words, in case density of the PCVD-SiOF film is more than 2.25 $g/cm^3$ dependency of film density on the flow rate can be decreased significantly, and therefore the PCVD-SiOF film having low relative dielectric constant of 3.6 or so can be obtained with good reproducibility even when manufacturing conditions are slightly varied. On the contrary, in case density of the PCVD-SiOF film is less than 2.25 $g/cm^3$, film density may be changed significantly depending on manufacturing conditions such as the flow rate, and at the same time relative dielectric constant is changed largely to thus reach 3.7 or more finally.

In addition, the PCVD-SiOF film which has stable characteristics can be obtained by using a combination of the tetraethylorthosilicate as Si supply gas (16 in FIG. 12), oxygen as oxygen supply gas (13 in FIG. 12) and $C_2F_6$ as fluorine supply gas (10 in FIG. 12) as material gases to form the insulating film having density of more than 2.25 $g/cm^3$.

Furthermore, the PCVD-SiOF film which has stable characteristics can be obtained by using $SiH_4$ as Si supply gas (33 in FIG. 12), $N_2O$ as oxygen supply gas (27 in FIG. 12) and $C_2F_6$ as fluorine supply gas (10, 30, 36 in FIG. 12) as material gases.

Besides, the PCVD-SiOF film which has stable characteristics can be obtained by using another combination, i.e., $SiH_4$ as Si supply gas (33 in FIG. 12), $N_2O$ as oxygen supply gas (27 in FIG. 12) and $SiF_4$ as fluorine supply gas (36 in FIG. 12) as material gases.

As stated above, by providing the SiOF film having density of 2.25 $g/cm^3$, the semiconductor device capable of reducing signal propagation delay can be derived.

According to the method for forming the interlayer insulating film of the present invention, as shown in FIG. 22, the fluorine type resin film 4 having high bridging density and excellent heat resistance because of being carbon rich can be obtained by effecting the plasma chemical vapor deposition method in a state wherein the hydrogen containing compound gas is mixed into fluorocarbon gas having the C/F ratio of 1/2.

If the ratio of C becomes higher, bridging density is increased and heat resistance can be improved, but relative dielectric constant is rendered high. Alternatively, if the ratio of F becomes higher, relative dielectric constant is rendered low, but reproducibility of the film is lessened by etching operation of F radical and heat resistance is lowered. Therefore, as the fluorocarbon being easily available, the one having the C/F ratio of 1/2 is suitable.

In the foregoing, by employing any one of $C_2F_4$, $C_3F_6$ and $C_4F_8$, especially $C_4F_8$ as the fluorocarbon gas, the interlayer insulating film having low relative dielectric constant such as relative dielectric constant of less than 2.5 and good residual film ratio can be achieved.

In addition, by employing any one of $H_2$, $SiH_4$, $C_2H_2$, $C_3H_8$, $C_2H_6$ and $CH_4$ as the hydrogen containing compound gas, the interlayer insulating film having low relative dielectric constant such as relative dielectric constant of less than 2.5 can be achieved. The relative dielectric constant is increased with the flow rate of the hydrogen containing compound. Especially, by employing any one of $C_2H_2$ and $C_3H_8$ as the hydrogen containing compound gas, the interlayer insulating film having low relative dielectric constant such as less than 2.5 and excellent heat resistance can be achieved.

Further, if the film forming temperature in the plasma chemical vapor deposition step is set at more than 250° C., the fluorine type resin film 4 having high bridging density and excellent heat resistance because of being carbon rich can be achieved.

Furthermore, according to the semiconductor device of the present invention, the interlayer insulating film is provided therein formed by any one of the above forming methods. In other words, if the fluorine type resin film 4 having low relative dielectric constant and excellent heat resistance is used as the interlayer insulating film, wiring delay time on the interconnection layer 3 of the high integration semiconductor device can be reduced significantly, and the reliability can be improved.

DESCRIPTION OF THE PREFERRED EMBODIMENTS

There will now be described preferred embodiments of the present invention with reference to the accompanying drawings hereinafter.

The inventors of the present invention have proposed the method wherein the low frequency (250 kHz) power source and the high frequency power source (13.56 kHz) are equipped and TEOS, oxygen and $C_2F_6$ are employed as material gases. In this event, humidity absorption of the SiOF film formed by the PCVD method is controlled by optimizing the applied amount of the low frequency power.

However, this controlling scheme is not always the best method since such low frequency power degrades characteristics of the transistors which are formed in the semiconductor substrate before forming the interlayer insulating film according to kinds of the semiconductor devices.

In addition, the interlayer insulating film having relative dielectric constant of about 3.4 to 3.8 (1 MHz) has been accomplished by controlling humidity absorption of the SiOF film. But in the near feature very high-speed logic LSIs, above the range of the relative dielectric constant is not always sufficient for high speed operation.

The inventors disclose as follows a method for forming an SiOF film which has a lower relative dielectric constant, an improved stability and a superior heat resistance, and a semiconductor device having the above SiOF film.

First Embodiment

Figure 1:
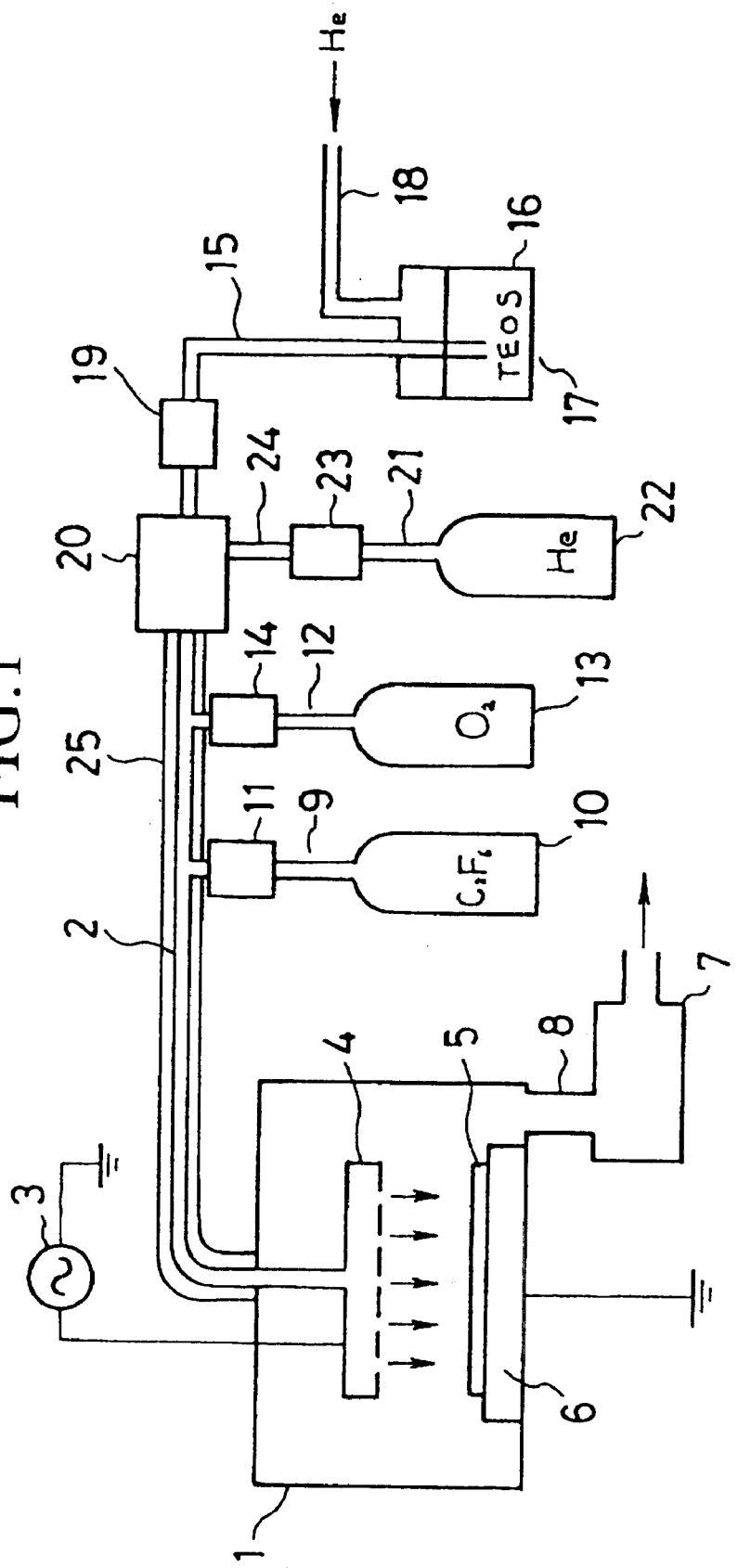
FIG. 1 is a schematic view showing a configuration of a plasma chemical vapor deposition equipment for use in the present invention.

FIG. 1 is a schematic view showing a configuration of a plasma chemical vapor deposition equipment for use in the present invention. Referring to FIG. 1, fundamental manufacturing method of the present invention will be explained.

This PCVD equipment comprises as main parts, for example, a reaction chamber 1 in which a pressure can be lowered at about 0.01 Torr when forming the film, a shower head type upper electrode 4 connected to a material gas supply piping 2 and connected to a high frequency power source 3 of 13.56 MHz, a lower electrode 6 serving as a mounting table for a processed substrate 5 and being grounded, and an exhaust port 8 connected to a vacuum pump 7.

Heating of the processed substrate 5 and the lower electrode 6 is effected with lamp heating using a lamp (not shown) placed in outside of the reaction chamber 1.

A $C_2F_6$ bomb 10 is connected to the material gas supply piping 2 via a piping 9, and a flow rate of $C_2F_6$ gas can be controlled by a mass flow controller 11.

Further, an $O_2$ bomb 13 is connected via a piping 12, and a flow rate of $O_2$ gas can be controlled by a mass flow controller 14.

Furthermore, a TEOS source is connected via a piping 15.

This TEOS source is composed of a TEOS vessel 17 in which liquid TEOS 16 is stored, and a piping 18 for supplying compressed He to the vessel 17. The piping 15 connected to the TEOS source is arranged to be inserted into the liquid TEOS 16.

The liquid TEOS is supplied into the piping 15 by providing the liquid He at a pressure of 0.5 to 1.0 kg/cm² from the piping 18. A supply amount of the liquid TEOS can be controlled by a mass flow controller 19 provided in the piping 15.

The liquid TEOS whose supply amount has been controlled by the mass flow controller 19 is vaporized in a vaporizer 20 to become a TEOS gas.

A He bomb 22 is connected to the vaporizer 20 via pipings 21 and 24, and a flow rate of He gas serving as a carrier gas can be controlled by a mass flow controller 23. He gas stabilizes a supply amount of the TEOS gas.

The He gas being controlled by the mass flow controller 23 is supplied to the vaporizer 20 via a piping 24, and then is supplied to the reaction chamber 1 together with the TEOS gas via the piping 2.

By heating the piping 2 by a heater 25 provided on the piping 2 at 100° C., vaporized TEOS can be prevented from being liquefied again in the piping 2.

In this manner, a method for supplying directly vaporized gas without a bubbler is called as direct injection. In the present invention, the flow rate of the TEOS gas means a flow rate in this gas state (a flow rate excluding the carrier gas).

The TEOS gas is supplied and at the same time $C_2F_6$ gas as well as $O_2$ are supplied respectively via the pipings 9 and 12. Plasma is generated by applying high frequency power between the shower head type upper electrode 4 and the lower electrode 6 from the high frequency power source 3. Under this condition, an SiOF film is deposited on the processed substrate 5.

Subsequently, various experimental results obtained by using the PCVD equipment will be explained with reference to FIGS. 2 to 10. Appropriate manufacturing conditions as an embodiment of the present invention will be discussed based on the experimental results.

Figure 2:
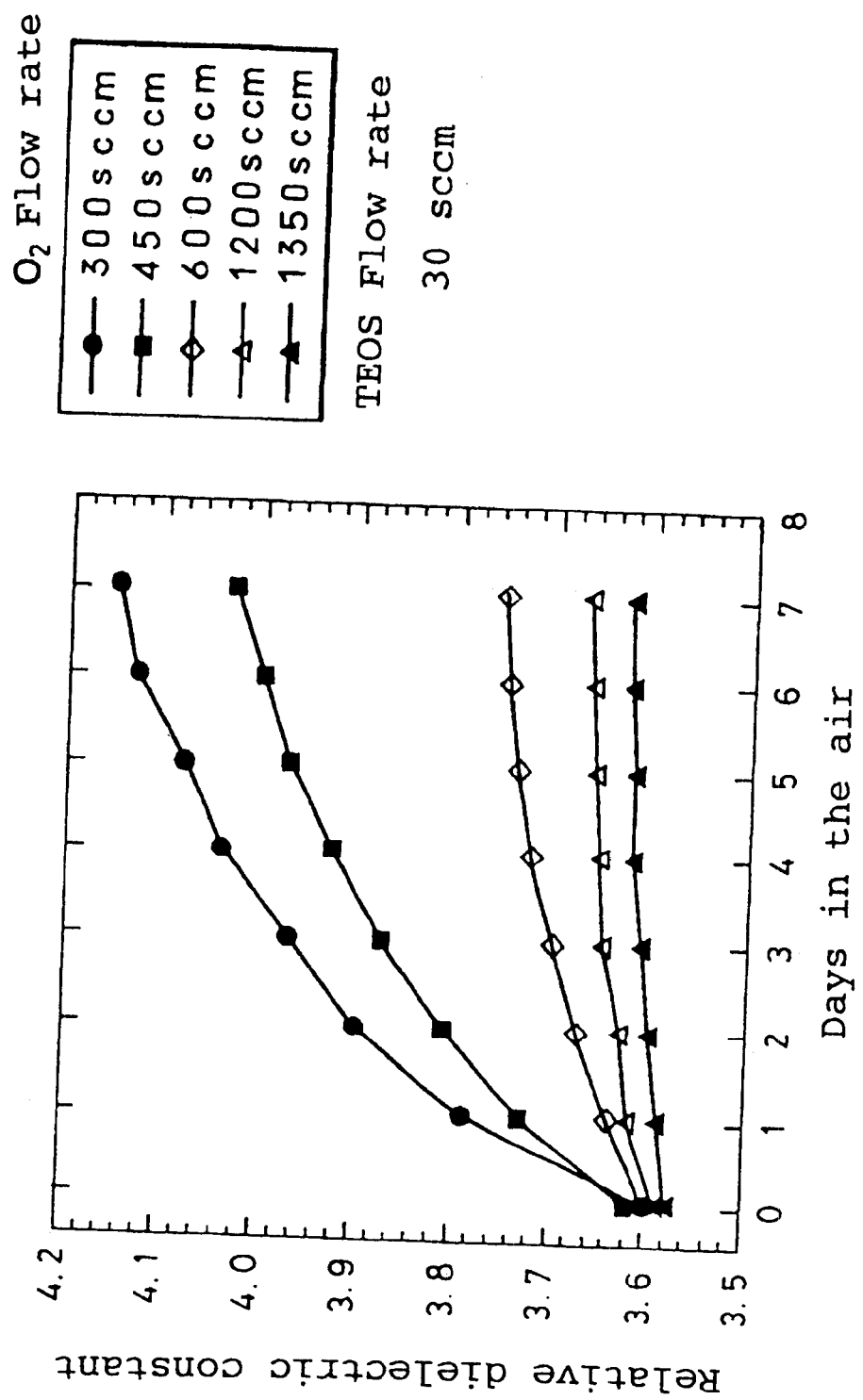
FIG. 2 is a characteristic view showing dependency of stability of relative dielectric constant of an SiOF film upon an $O_2$ flow rate if a ratio of $C_2F_6$/TEOS is set to 7 as the basis of a first embodiment of the present invention.

FIG. 2 shows the measured result of a change with the passage of time of relative dielectric constant of an SiOF film which is formed by the experiment and is then left in the air. While keeping flow rates of TEOS gas, $C_2F_6$ gas, and He gas respectively at 30 sccm, 210 sccm (a flow rate ratio of $C_2F_6$ and TEOS, i.e., $C_2F_6$/TEOS=7) and 500 sccm, the flow rate of $O_2$ gas is changed like 300, 450, 600, 1200, 1350 sccm. In this event, applied power is 1.80 W/cm², film forming pressure is 5 Torr, and temperature of the mounting table 6 is 400° C.

Under these conditions, the SiOF film is deposited to a 600 nm film thickness at a deposition rate of 200 to 270 nm/min.

As may be evident from FIG. 2, if the flow rate $C_2F_6$/TEOS is 7, the relative dielectric constant in forming the film is about 3.6, and a dependency of the relative dielectric constant on the flow rate of $O_2$ scarcely appears.

If the film is left in the air, the relative dielectric constant is however increased gradually because the film absorbs moisture in the air.

In the events that the flow rate of $O_2$ is 300 sccm (the flow rate of $O_2$ and TEOS, i.e., $O_2$/TEOS=10) and the flow rate of $O_2$ is 450 sccm ($O_2$/TEOS=15), the film exhibits a large change with the passage of time. When it is left for seven days in the air, the relative dielectric constant is increased up to about 4.0 to 4.2. No merit can therefore be obtained in practical use because there is no difference between this film and the $PCVD-SiO_2$ film.

If the flow rate of $O_2$ is more than 600 sccm ($O_2$/TEOS= 20), the film exhibits a small change with the passage of time. After the film is left in the air for about four days, a saturation tendency of the relative dielectric constant occurs so as to have a value of about In this manner, if the flow rate of $O_2$ is set more than 20 times as large as the flow rate of TEOS, the film having a stable change with the passage of time and low relative dielectric constant can be realized. However, if the flow rate of $O_2$ is in excess of 1350 sccm ($O_2$/TEOS=45) or more, the film forming rate is reduced and also a step coverage for covering wiring steps, i.e., level difference between interconnections becomes poor. As a result, it may be considered that 1200 sccm ($O_2$/TEOS=40) is suitable for an upper limit of the flow rate of $O_2$.

Figure 3:
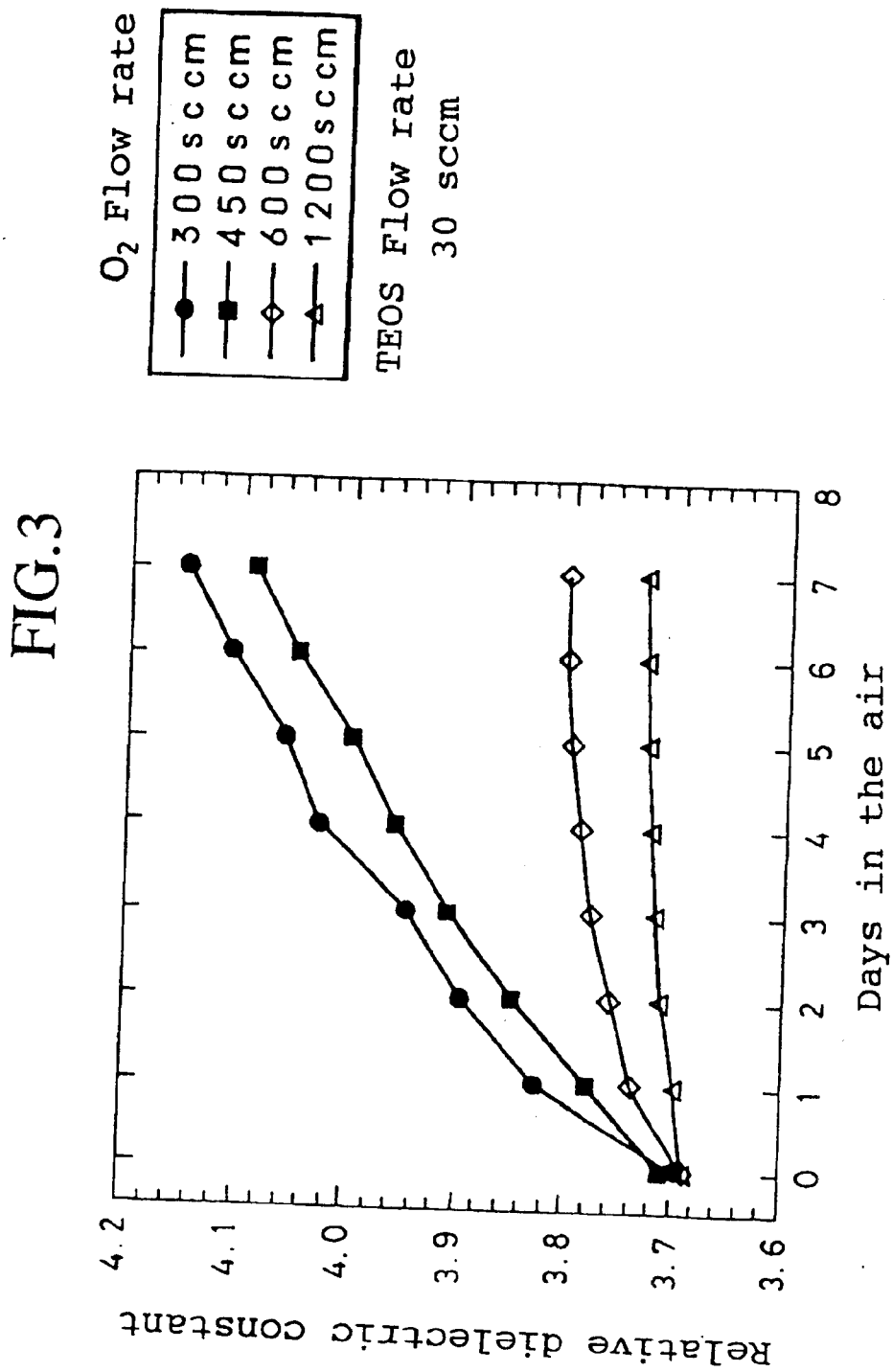
FIG. 3 is a characteristic view showing dependency of stability of dielectric constant of an SiOF film upon an $O_2$ flow rate if a ratio of $C_2F_6$/TEOS is set to 5 as the basis of the first embodiment of the present invention.

Next, the variation result of the relative dielectric constant of an SiOF film which is formed by the experiment and is then left in the air will be discussed with reference to FIG. 3. In order to form the SiOF film, the flow rate of $O_2$ gas is changed like 300, 450, 600, 1200 sccm while maintaining flow rates of TEOS gas, $C_2F_6$ gas, and He gas respectively at 30 sccm, 150 sccm ($C_2F_6$/TEOS=5) and 500 sccm. In this event, other conditions are identical to those in FIG. 2, that is, applied power is 1.80 W/cm², film forming pressure is 5 Torr, and temperature of the mounting table 6 is 400° C.

Under these conditions, the SiOF film is deposited to a 600 nm film thickness at a deposition rate of 200 to 270 nm/min.

In this case, the relative dielectric constant in forming the film is about 3.7 which is slightly high. Like the case in FIG. 2, a dependency of the relative dielectric constant on the flow rate of $O_2$ scarcely appears. If the film is left in the air, the relative dielectric constant is however increased gradually because the film absorbs moisture in the air.

In the events that the flow rate of $O_2$ is 300 sccm ($O_2$/TEOS=10) and the flow rate of $O_2$ is 450 sccm ($O_2$/TEOS=15), the film exhibits a large change with the passage of time. When it is left for seven days in the air, the relative dielectric constant is increased up to about 4.0 to 4.2. No merit can therefore be obtained in practical use because there is no difference between this film and the $PCVD-SiO_2$ film.

If the flow rate of $O_2$ is more than 600 sccm ($O_2$/TEOS= 20), the film exhibits a small change with the passage of time. After the film is left in the air for about four days, a saturation tendency of the relative dielectric constant occurs so as to have a value of about 3.8.

Figure 5:
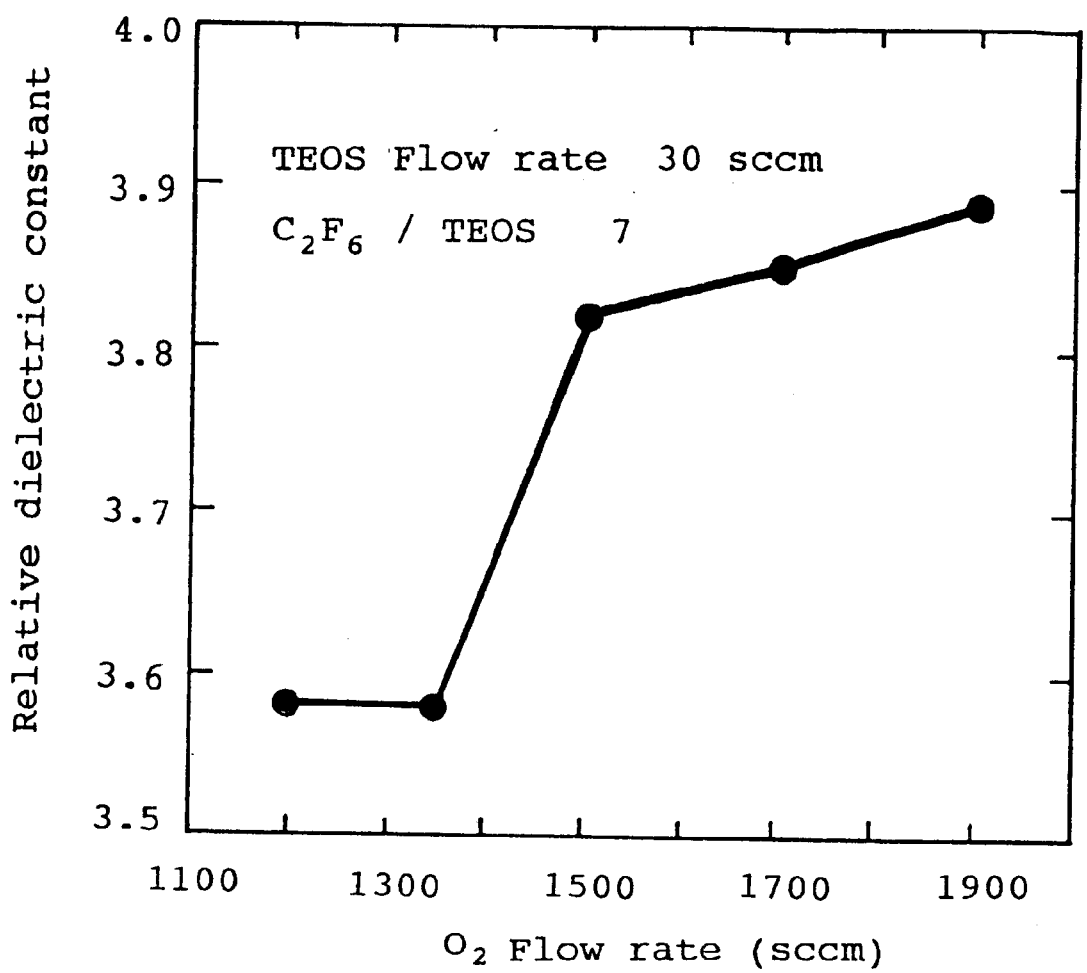
FIG. 5 is a characteristic view showing dependency of relative dielectric constant upon $O_2$ flow rate if a ratio of $C_2F_6$/TEOS is set to 7 as a basis of the first embodiment of the present invention.

An experiment has been carried out in order to find how far the $O_2$ flow rate can be increased, while keeping the relative dielectric constant small, beyond the scope shown in FIG. 2. The result of this experiment is shown in FIG. 5. In this experiment, the relative dielectric constant was measured with changing the $O_2$ flow rate but without changing the flow rate of TEOS and the $C_2F_6$/TEOS ratio. In fact, measurements were carried out at 1500 sccm, 1700 sccm, 1900 sccm of the $O_2$ flow rate while keeping the flow rate of TEOS in 30 sccm and the $C_2F_6$/TEOS ratio in 7. As is clearly seen from FIG. 5, the relative dielectric constant increases drastically around the $O_2$ flow rate of 1400 sccm to 1500 sccm. Above 1500 sccm of the $O_2$ flow rate, the relative dielectric constant increases gradually. As a result, the $O_2$ flow rate should, preferably, be set below 1500 sccm ($O_2$/TEOS ratio=50) in order to keep the relative dielectric constant small.

In this fashion, if the flow rate of $O_2$ is set more than 20 times as large as the flow rate of TEOS, the film having a stable change with the passage of time and low relative dielectric constant can be realized. However, if the flow rate of $O_2$ becomes too much, the film forming rate is excessively lowered and also a step coverage becomes poor, so that problems will arise in practical use. As a result, it may be considered that 1200 sccm ($O_2$/TEOS=40) is suitable for an upper limit of the flow rate of $O_2$.

If the flow rate of $C_2F_6$ is set less than five times in contrast to that of TEOS, the relative dielectric constant is further increased larger than 3.7 in forming the film since fluorine density in the SiOF film is reduced. Since addition of fluorine has less meaning if a change with the passage of time thereafter is taken into consideration, it is suitable for a lower limit that the flow rate ratio of $C_2F_6$ to TEOS is five times.

Figure 4:
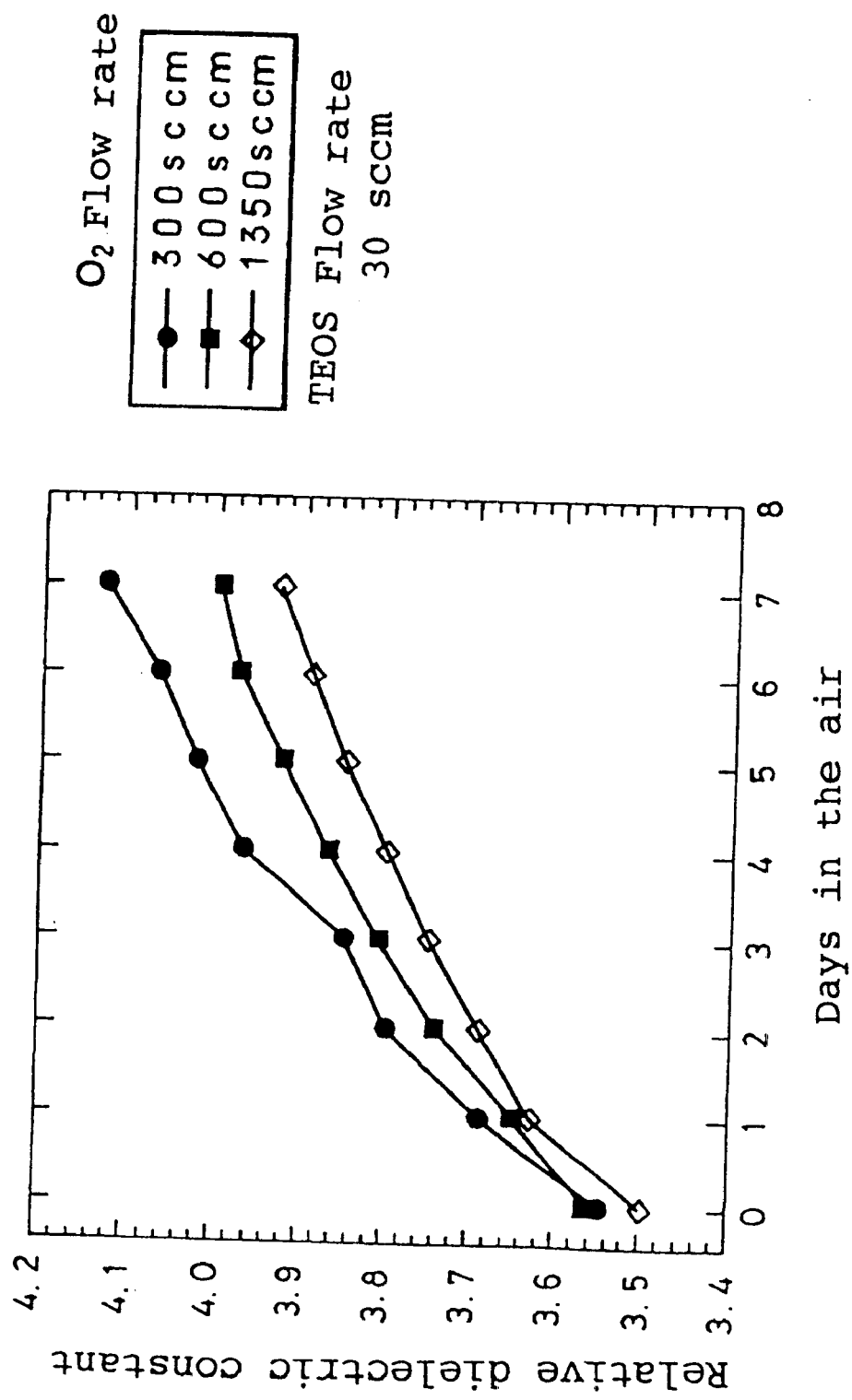
FIG. 4 is a characteristic view showing dependency of stability of relative dielectric constant of an SiOF film upon an $O_2$ flow rate if a ratio of $C_2F_6$/TEOS is set to 8 as the basis of the first embodiment of the present invention.

Next, the variation result of the relative dielectric constant of an SiOF film which is formed by the experiment and is then left in the air will be discussed with reference to FIG. 4. In order to deposit the SiOF film, the flow rate of $O_2$ gas is changed like 300, 600, 1350 sccm while keeping flow rates of TEOS gas, $C_2F_6$ gas, and He gas respectively at 30 sccm, 240 sccm ($C_2F_6$/TEOS=8) and 500 sccm. In this event, other conditions are identical to those in FIG. 2, that is, applied power is 1.80 W/cm$^2$, film forming pressure is 5 Torr, and temperature of the mounting table 6 is 400° C.

Under these conditions, the SiOF film is deposited to a 600 nm film thickness at a deposition rate of 190 to 210 nm/min.

In this case, the relative dielectric constant in forming the film is about 3.5 which is considerably low. Like the case in FIG. 2, a dependency of the relative dielectric constant upon the flow rate of $O_2$ scarcely appears. If the film is left in the air, the relative dielectric constant is increased gradually because the film absorbs moisture in the air.

In this case, even if the flow rate of $O_2$ is 1350 sccm ($O_2$/TEOS=45), the film shows a large change with the passage of time. When it is left for seven days in the air, the relative dielectric constant becomes 3.9 and saturation tendency of the relative dielectric constant does not appear. Accordingly, after the film is left in the air for about four days, since it is presumed that the relative dielectric constant will be increased up to more than 4.0, addition of fluorine becomes meaningless because there is no difference between this film and the PCVD-SiO$_2$ film.

As above, if the flow rate of $C_2F_6$ is set more than 8 times as large as the flow rate of TEOS, a change with the passage of time is enhanced and finally the film having low relative dielectric constant cannot be realized. It is suitable for an upper limit that the flow rate of $C_2F_6$ is seven times as large as that of TEOS.

With the above, if all experimental results in FIGS. 2 to 5 being judged totally, 20 to 40 times of the flow rate ratio of $O_2$ to TEOS is desired, and 5 to 7 times of the flow rate ratio of $C_2F_6$ to TEOS is desired.

Subsequently, since a stability of the relative dielectric constant has been measured while changing other conditions, the results will be discussed with reference to FIGS. 5 to 10.

Figure 6:
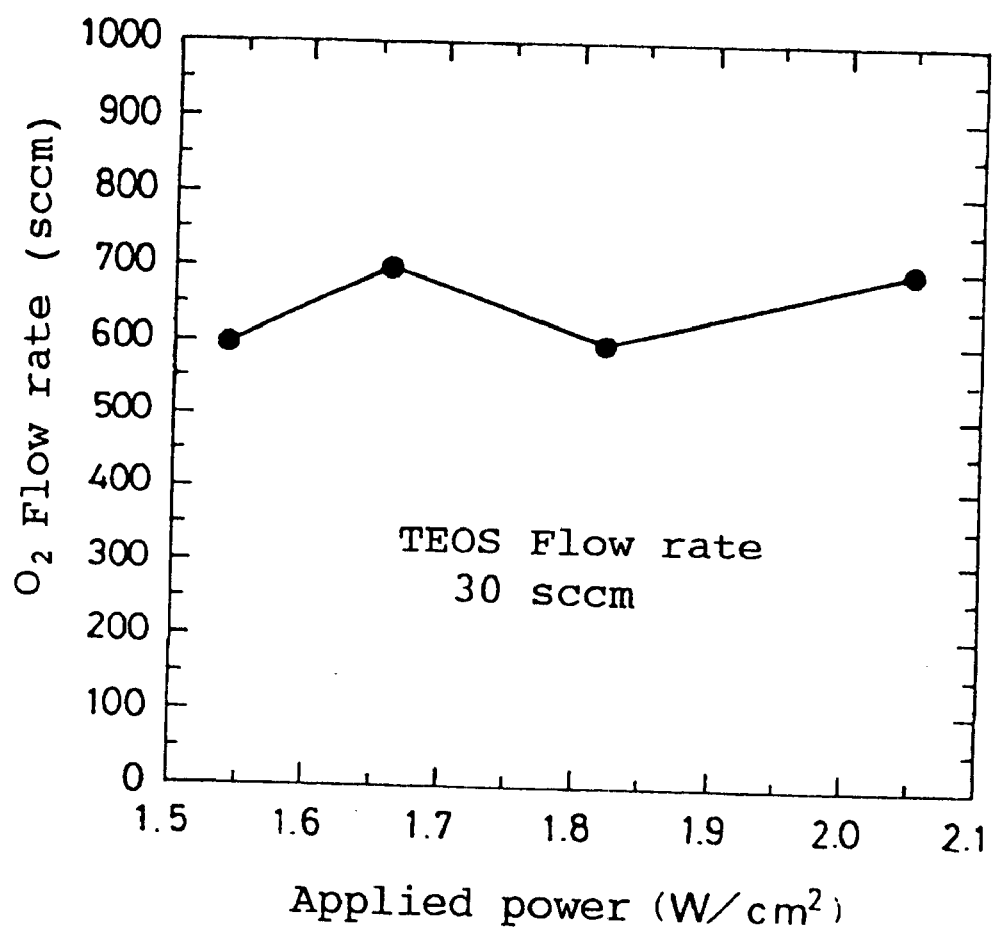
FIG. 6 is a characteristic view showing dependency of an $O_2$ flow rate necessary for stability of relative dielectric constant of an SiOF film upon applied power if a ratio of $C_2F_6$/TEOS is set to 7 as the basis of the first embodiment of the present invention.

First, FIG. 6 shows dependency of an $O_2$ flow rate necessary for stability of relative dielectric constant of an SiOF film upon applied power if the applied power (frequency 13.56 MHz) is varied. As the film forming conditions, flow rates of TEOS gas, $C_2F_6$ gas, and He gas are set respectively at 30 sccm, 210 sccm ($C_2F_6$/TEOS=7) and 500 sccm, and the film forming pressure is set at 5 Torr, and the temperature of the mounting table is set at 400° C.

The stability means a stability such as the stability obtained in case the flow rate of $O_2$ is 600 sccm in FIG. 2. In addition, since it is evident from FIGS. 2 to 4 that the more the flow rate of $O_2$, the more the stability is increased, it indicates a lower limit value of the flow rate of $O_2$ which enables the stability.

In this experiment, as shown in FIG. 6, the applied power has been varied from 1.54 W/cm$^2$ to 2.05 W/cm$^2$ which is the practical range usually used. According to this, in the range of 1.54 W/cm to 2.05 W/cm2, the flow rate of $O_2$ is ranging from 600 sccm to 700 sccm so that the dependency on the applied power seldom appears.

The above numerical range such as 20 to 40 times of the $O_2$/TEOS ratio may thus be effected substantially irrespective of the applied power.

Figure 7:
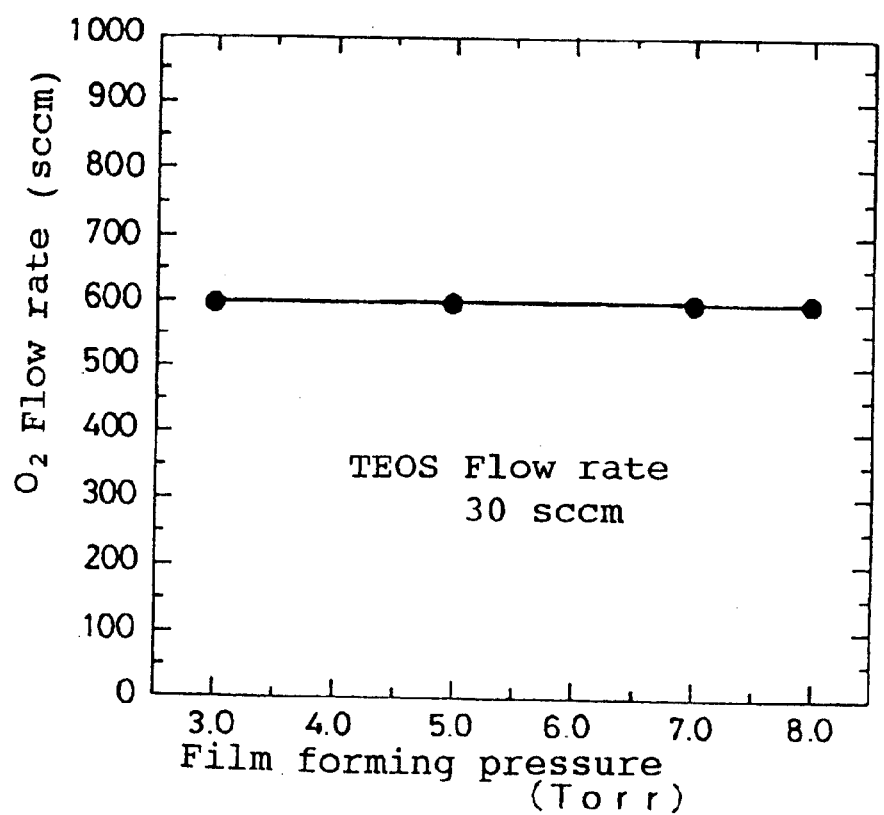
FIG. 7 is a characteristic view showing dependency of an $O_2$ flow rate necessary for stability of relative dielectric constant of an SiOF film upon a film forming pressure if a ratio of $C_2F_6$/TEOS is set to 7 as the basis of the first embodiment of the present invention.

FIG. 7 shows dependency of an $O_2$ flow rate necessary for stability of relative dielectric constant of an SiOF film upon a film forming pressure if the film forming pressure in forming the film is varied. As the film forming conditions, flow rates of TEOS gas, $C_2F_6$ gas, and He gas are set respectively at 30 sccm, 210 sccm ($C_2F_6$/TEOS=7) and 500 sccm, and the applied power is set to 1.80 W/cm$^2$, and the temperature of the mounting table is set at 400° C. In this event, the meaning of stability is identical to the case in FIG. 6.

In this experiment, the film forming pressure has been varied from 3.0 Torr to 8.0 Torr which is practical range usually used. According to the resultant result, the flow rate of $O_2$ is fixed at about 600 sccm in the range of 3.0 Torr to 8.0 Torr, so that no dependency on the film forming pressure appears.

The above numerical range such as 20 to 40 times of the $O_2$/TEOS ratio may thus be effected substantially irrespective of the film forming pressure.

Figure 8:
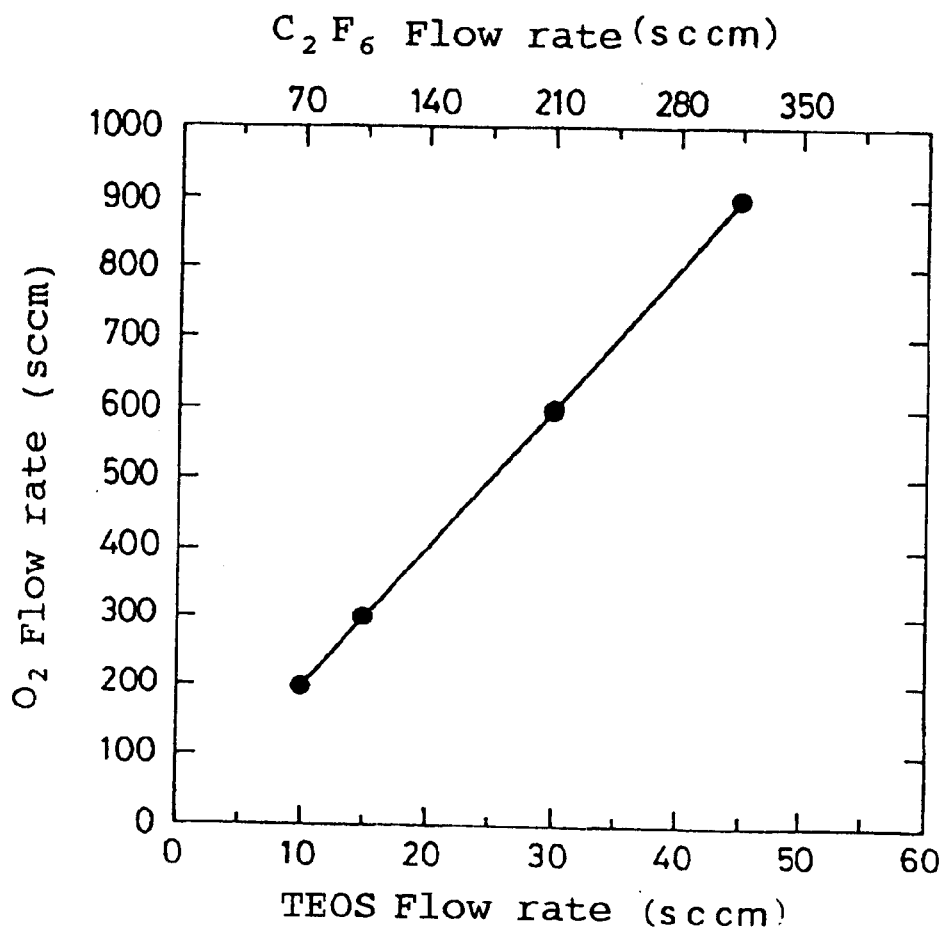
FIG. 8 is a characteristic view showing dependency of an $O_2$ flow rate necessary for stability of relative dielectric constant of an SiOF film upon a total gas flow rate if a ratio of $C_2F_6$/TEOS is set to 7 as the basis of the first embodiment of the present invention.

FIG. 8 shows dependency of an $O_2$ flow rate necessary for stability of relative dielectric constant of an SiOF film upon a total gas flow rate of $O_2$ in case the flow rate of He gas is fixed at 500 sccm, the flow rate ratio of $C_2F_6$/TEOS is fixed at 7, and a total flow rate of both gases is varied. As the film forming conditions, the film forming pressure is set at 5 Torr, the applied power is set at 1.8 W/cm$^2$ and the temperature of the mounting table is set at 400° C. In this event, the meaning of stability is identical to the case in FIG. 6.

In this experiment, as shown in FIG. 8, the total flow rate of TEOS gas and $C_2F_6$ gas has been varied in the range from 80 (10:70) sccm to 360 (45:315) sccm. Numerals in the parenthesis show respective flow rates of the TEOS gas and the $C_2F_6$ gas.

According to the results, in case the total flow rate is 80 (10:70) sccm, the stability of the relative dielectric constant can be obtained when the flow rate of $O_2$ is 200 sccm, i.e., $O_2$/TEOS=20. Similarly, in case the total flow rate is 120 (15:105) sccm, the stability can be obtained when the flow rate of $O_2$ is 300 sccm, i.e., $O_2$/TEOS=20. In case the total flow rate is 240 (30:210) sccm, the stability can be obtained when the flow rate of $O_2$ is 600 sccm, i.e., $O_2$/TEOS=20. In case the total flow rate is 360 (45:315) sccm, the stability can be obtained when the flow rate of $O_2$ is 900 sccm, i.e., $O_2$/TEOS=20.

As has been mentioned above, since the total flow rate of the TEOS gas and the $C_2F_6$ gas and the flow rate of $O_2$ required for stabilization of the relative dielectric constant is in linear relation, the above numerical range such as 20 to 40 times of the $O_2$/TEOS ratio may thus be effected substantially irrespective of the total flow rate of the TEOS gas and the $C_2F_6$ gas.

Figure 9:
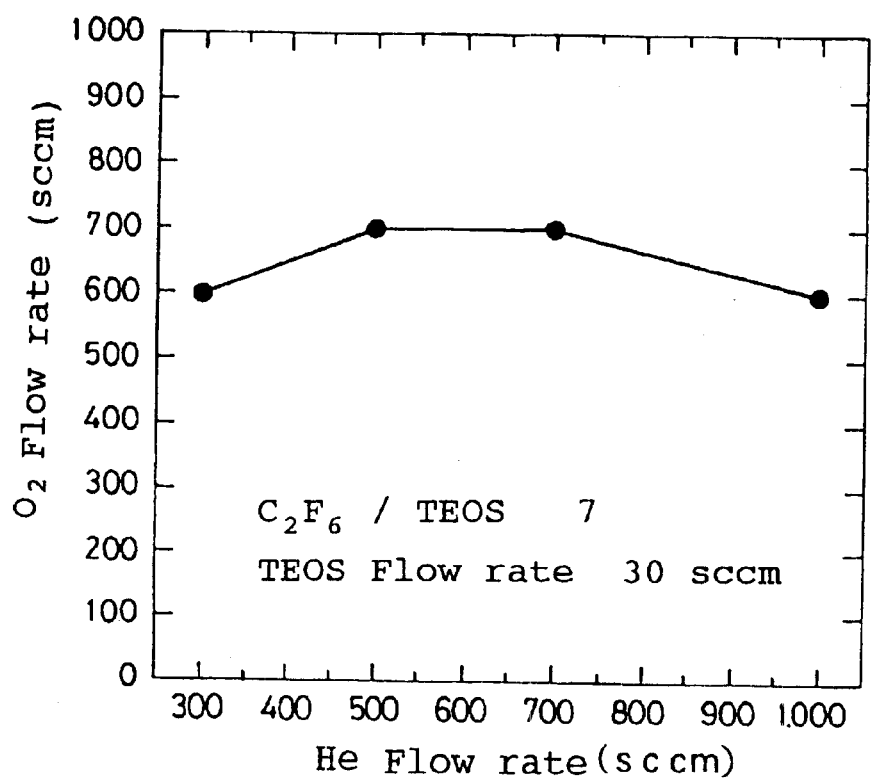
FIG. 9 is a characteristic view showing dependency of an $O_2$ flow rate necessary for stability of relative dielectric constant of an SiOF film upon a He gas flow rate if a ratio of $C_2F_6$/TEOS is set to 7 as the basis of the first embodiment of the present invention.

FIG. 9 shows dependency of an $O_2$ flow rate necessary for stability of relative dielectric constant of an SiOF film upon a He gas flow rate in case the flow rate of He gas is varied under the condition wherein the flow rates of the TEOS gas and the $C_2F_6$ gas are respectively at 30 sccm and 210 sccm ($C_2F_6$/TEOS=7). As other film forming conditions, the film forming pressure is set at 5 Torr, the applied power is set at 1.80 W/cm$^2$ and the temperature of the mounting table is set at 400° C. In this event, the meaning of stability is identical to the case in FIG. 6.

In this experiment, as shown in FIG. 9, the flow rate of the He gas has been varied from 300 sccm to 1000 sccm which is the practical range usually used. According to the results, in the range of 300 sccm to 1000 sccm, the flow rate of $O_2$ necessary for the stability of the relative dielectric constant is ranging from 600 sccm to 700 sccm so that the dependency on the flow rate of the He gas in no way appears.

The above numerical range such as 20 to 40 times of the $O_2$/TEOS ratio may thus be effected substantially regardless of the flow rate of the He gas.

Figure 10:
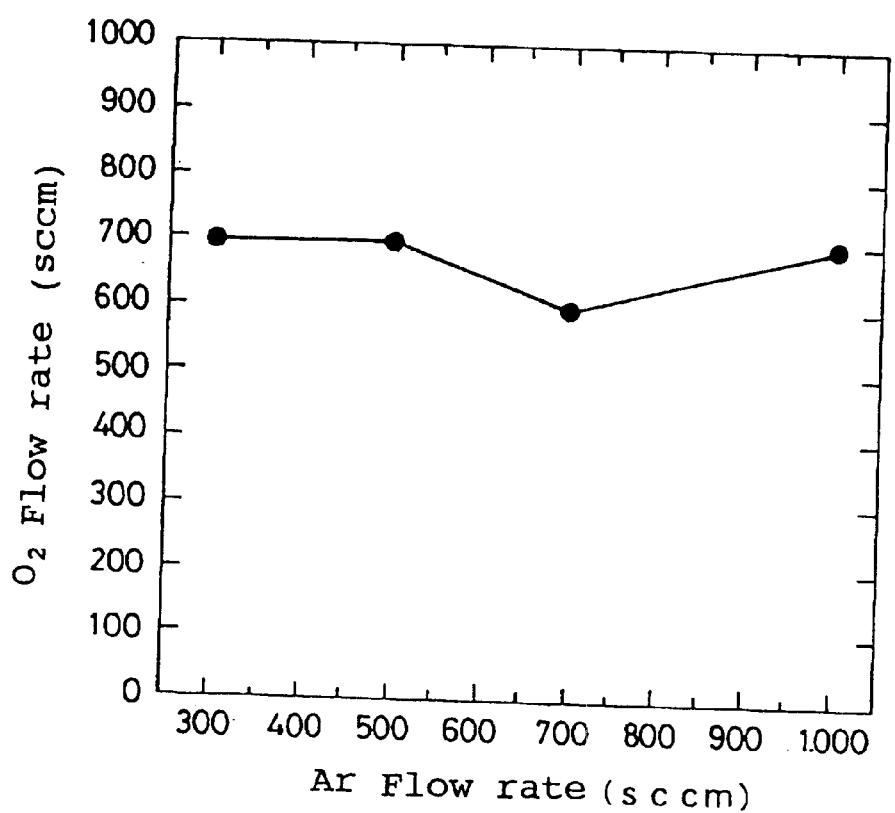
FIG. 10 is a characteristic view showing dependency of an $O_2$ flow rate necessary for stability of relative dielectric constant of an SiOF film upon an Ar gas flow rate if a ratio of $C_2F_6$/TEOS is set to 7 as the basis of the first embodiment of the present invention.

FIG. 10 uses an Ar gas in place of He gas used in the experiment in FIG. 9. In other words, if the flow rate of Ar gas is varied while flow rates of TEOS gas and $C_2F_6$ gas are fixed respectively at 30 sccm and 210 sccm ($C_2F_6$/TEOS=7), dependency of the $O_2$ flow rate necessary for stability of relative dielectric constant of an SiOF film upon an Ar gas flow rate has been measured. As other film forming conditions, the film forming pressure is set at 5 Torr, the applied power is set at 1.80 W/cm , and the temperature of the mounting table is set at 400° C. In this case, the meaning of stability is identical to the case in FIG. 6.

In this experiment, as shown in FIG. 10, the flow rate of Ar gas has been varied from 300 sccm to 1000 sccm which is the practical range usually used. According to the resultant results, in the range of 300 sccm to 1000 sccm, the flow rate of $O_2$ necessary for the stability of the relative dielectric constant is ranging from 600 sccm to 700 sccm so that the dependency on the flow rate of $O_2$ scarcely appears.

The above numerical range such as 20 to 40 times of the $O_2$/TEOS ratio may thus be effected substantially irrespective of the flow rate of Ar gas.

The reason why the same result as the He gas can be obtained even when Ar gas is used as the carrier gas can be regarded as that both gases are inert gases and are not directly concerned with chemical reactions in the course of forming the film. Accordingly, the above numerical range such as 20 to 40 times of the $O_2$/TEOS ratio may be effected substantially irrespective of kinds of the carrier gas so far as the inert gas is used as the carrier gas.

In the experiments in FIGS. 5 to 9, although the ratio of $C_2F_6$/TEOS is fixed at 7, it can be readily supposed that these experimental results are true of the cases of $C_2F_6$/TEOS=5 to 7. These conditions are applicable to at least the preferred embodiments shown in FIGS. 2 to 3.

In the experiments in FIGS. 2 to 9, although the temperature of the mounting table is constant at 400° C., this 400° C. is optimum temperature in the PCVD method of the present invention. There is no meaning if the experiment has be effected by changing this temperature.

In other words, the temperature is excessively higher than 400° C., aluminum interconnection layers, ohmic electrodes, or schottky barrier electrodes, as the case may be, is affected by such high temperature, which yielding an upper limit as a matter of course. On the other hand, the temperature is excessively lower than 400° C., degradation in film quality such as reduction in density of the SiOF film occurs, which yielding a lower limit as a matter of course.

For purposes of example, the temperature of the mounting table in the range of 360 to 420° C. is suitable for the PCVD method of the present invention.

Next, the reason why the relative dielectric constant of the SiOF film can be stabilized by optimizing an added amount of the $O_2$ gas against TEOS is measured in the experiment, and the results will be discussed with reference to FIG. 11.

Figure 11:
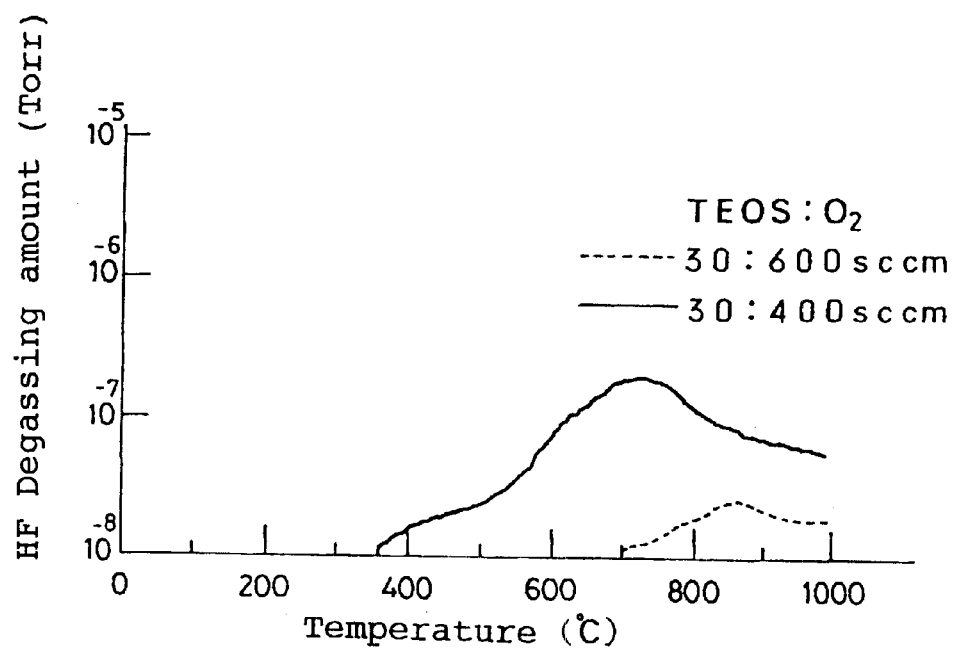
FIG. 11 is a characteristic view showing dependency of an HF degassing amount in TDS analysis upon film forming conditions as the basis of the first embodiment of the present invention.

FIG. 11 shows the results of TDS (Thermal Desorption Spectroscopy) analysis as for the SiOF film wherein the $O_2$ flow rate is optimized and the SiOF film unoptimized.

In the former optimized SiOF film, the gas flow rate conditions are determined such that TEOS:$O_2$:He=30 sccm:600 sccm: 500 sccm while, in the latter unoptimized SiOF film, the gas flow rate conditions are also determined such that TEOS:$O_2$:He=30 sccm:400 sccm:500 sccm.

This TDS analysis is also called as a thermal desorption method. Measured sample is heated under high vacuum to raise its temperature, and elements and molecules residing in the sample can be identified based on the molecular weight of discharged gas when increasing the temperature. In the event of the SiOF film, since fluorines in the film are disconnected as hydrogen fluoride (HF), an amount of disconnected fluorine is measured in FIG. 11.

As may be apparent from FIG. 11, if the temperature of the sample is increased, degassing of HF occurs at 700° C. or more in the SiOF film wherein the flow rate of $O_2$ is optimized. On the contrary, in the SiOF film wherein the flow rate of $O_2$ is not optimized, degassing already commences at less than 400° C. and thus an amount of degassing is different significantly.

More particularly, it is suggested that, in the case of the SiOF film wherein the flow rate of $O_2$ is not optimized, fluorine atoms in the film reside as simple substance not to combine with silicon atoms. It may thus be supposed that such uncombined fluorine atoms are concerned with absorption of moisture ($H_2O$).

From judging the above results totally, if the $C_2F_6$/TEOS ratio is increased to 20 to 40 times, the SiOF film which has stable relative dielectric constant and low relative dielectric constant can be deposited a practical film forming rate to have good step coverage, without regard to film forming pressure, applied power, total gas flow rate, flow rate of carrier gas, and kinds of carrier gas.

In that case, if the $C_2F_6$/TEOS ratio is increased to five to seven times, an SiOF film having lower relative dielectric constant than the PCVD-$SiO_2$ film can be formed stably. This leads to reduction of signal propagation delay in the semiconductor circuit devices.

In the first embodiment of the present invention, $C_2F_6$ has been used as the fluorine source. This is because $C_2F_6$ is mostly suitable for control of humidity absorption and low relative dielectric constant.

More particularly, $C_4F_8$, $C_3F_6$, or $CHF_3$ may be listed further as the fluorine source. However, since they have a high polymerization characteristic to form easily a polymer of carbon and fluorine in plasma, such polymer is easy to reside in the SiOF film as impurity so that control of humidity absorption becomes difficult.

SiF$_4$ or CF$_4$ may be used as other fluorine source, but these gases are difficult to be taken into the film since their decomposition efficiencies in plasma are poor and accordingly it is difficult to realize low relative dielectric constant.

In the first embodiment of the present invention, although the PCVD equipment employing the direct injection method shown in FIG. 1 has been used, another PCVD equipment employing the bubbler usually utilized as the TEOS source may be used. In this case, control of the flow rate of the TEOS gas is difficult.

Although the lamp heating has been used as the heating means, a resistance heating may be used.

Although the advantages in the foregoing description states the case where the present invention has been applied to the interlayer insulating film of the semiconductor integrated circuit device, the method for forming the insulating film of the present invention is not restricted to the method for forming the interlayer insulating film of the semiconductor integrated circuit device, but it may also be applied to other dielectric material integrated circuit devices such as an optical IC.

Second to Fourth Embodiments

First, fundamental manufacturing methods as the basis of second to fourth embodiments of the present invention will be explained with reference to FIGS. 12 to 14.

Figure 12:
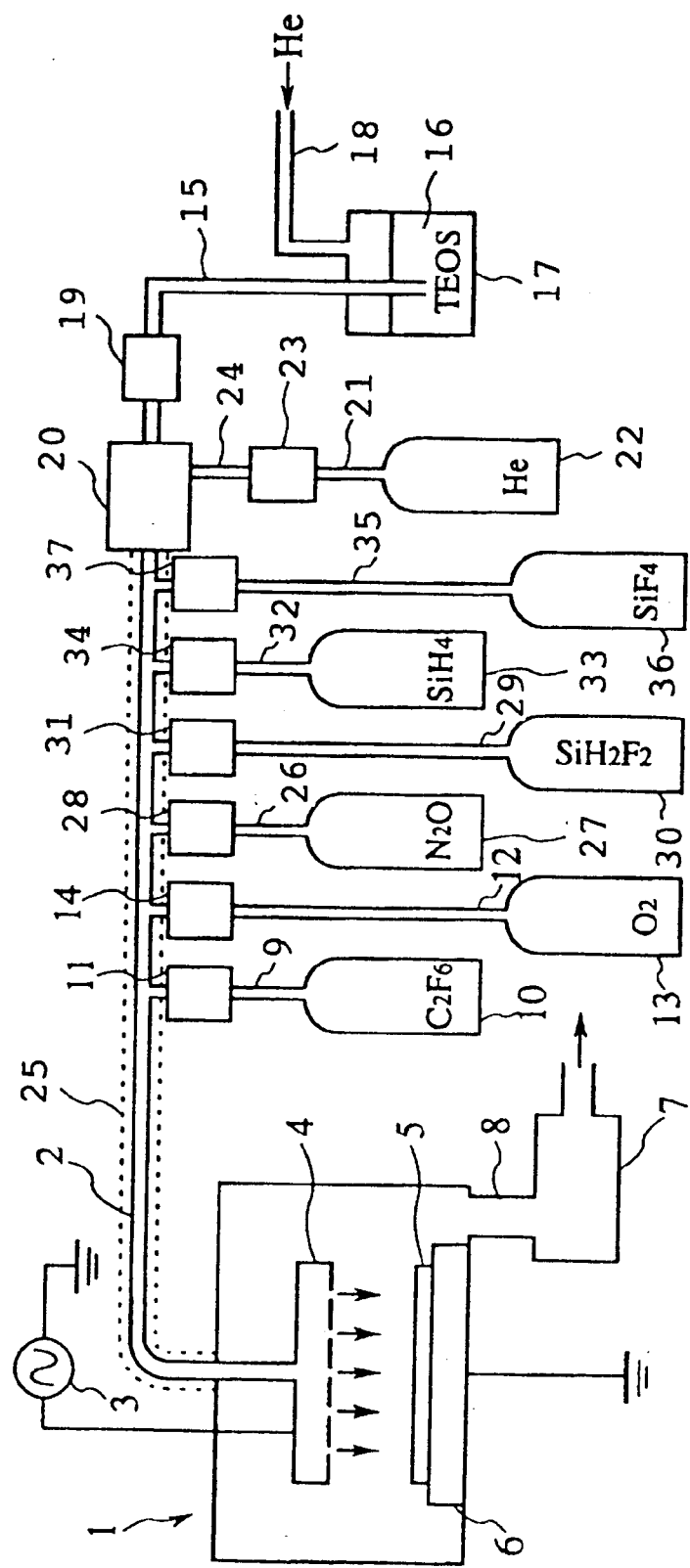
FIG. 12 is a schematic view showing a configuration of another plasma chemical vapor deposition equipment for use in the present invention.

FIG. 12 is a schematic view showing a configuration of another plasma chemical vapor deposition equipment (PCVD equipment) for use in the present invention.

This PCVD equipment has the same basic configuration as that shown in FIG. 1, but it has many kinds of reaction gas to be used in contrast to that shown in FIG. 1. In FIG. 12, like reference numerals in FIG. 1 designate like parts in FIG. 1.

In addition to the material gases used in the equipment in FIG. 1, additional material gases are added as described in the following, and pipings for supplying these material gases are connected to the material gas supply piping 2. Only required material gases may be supplied to the reaction chamber 1 via the material gas supply piping 2. Merely different portions from those in FIG. 1 will be explained hereinbelow.

More particularly, an N$_2$O bomb 27 is connected via a piping 26, and a flow rate of N$_2$O gas can be controlled by a mass flow controller 28.

Further, an SiH$_2$F$_2$ bomb 30 for supplying fluorine is connected via a piping 29, and a flow rate of SiH$_2$F$_2$ gas can be controlled by a mass flow controller 31.

Furthermore, an SiH$_4$ bomb 33 serving as an Si supply gas is connected via a piping 32, and a flow rate of SiH$_4$ gas can be controlled by a mass flow controller 34.

Besides, an SiF$_4$ bomb 36 for supplying fluorine is connected via a piping 35, and a flow rate of SiF$_4$ gas can be controlled by a mass flow controller 37.

If SiH$_4$ is used as an Si supply source, SiH$_4$ is supplied from the SiH$_4$ bomb 33 via the piping 32, and at the same time N$_2$O as an oxygen supply source and SiH$_2$F$_2$ as a fluorine supply source are supplied respectively via the pipings 26 and 29. Subsequently, plasma is generated by applying high frequency power between the shower head type upper electrode 4 and the lower electrode 6 from the high frequency power source 3. Under this condition, an SiOF film is deposited on the processed substrate 5.

If SiH$_4$ is used as an Si supply source and also SiF$_4$ is used as a fluorine supply source, N$_2$O as an oxygen supply source and SiF$_4$ as a fluorine supply source are supplied respectively via the pipings 15 and 35 at the same time SiH$_4$ is supplied. Subsequently, plasma is generated by applying high frequency power between the shower head type upper electrode 4 and the lower electrode 6 from the high frequency power source 3. Under this condition, an SiOF film is stacked on the processed substrate 5.

Various experimental results obtained using the PCVD equipment will be explained with reference to FIGS. 12 to 20, and preferable conditions as embodiments of the present invention will in turn be discussed based on the experimental results. In this event, since a humidity absorption characteristic causing unstableness of relative dielectric constant of the SiOF film depends upon density reduction of the SiOF film, presence of Si—OH bonds, Si bond defects, or presence of C (carbon) serving as impurity, influence of these matters upon unstableness of the relative dielectric constant of the SiOF film will be verified first.

Figure 13:
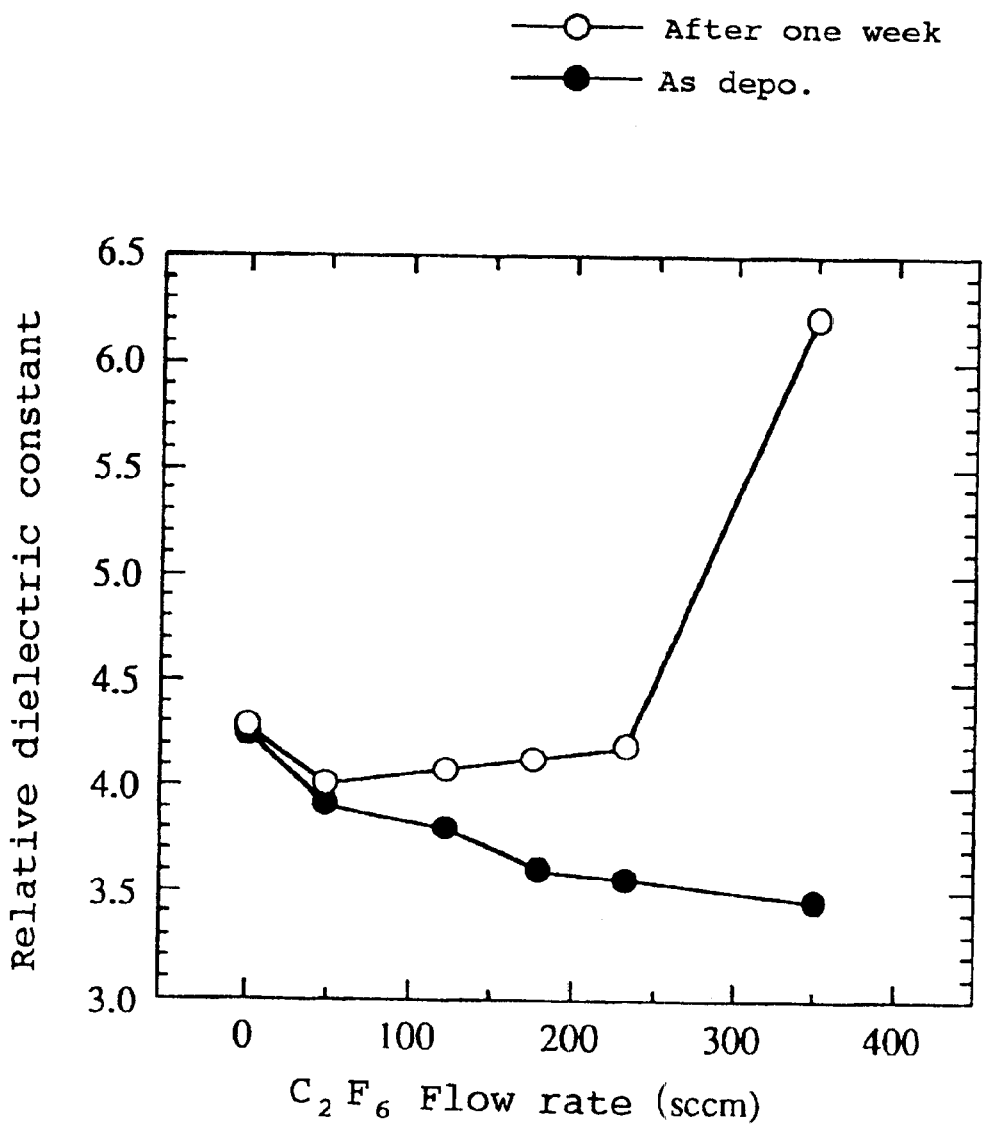
FIG. 13 is a characteristic view showing dependency of a change with the passage of time of a relative dielectric constant of an SiOF film upon a $C_2F_6$ gas flow rate as the basis of second to fourth embodiments of the present invention.

FIG. 13 shows variation in density of the SiOF film derived from the experiment, and specifically shows variation in a relative dielectric constant when the SiOF film being left in the air for one week. With keeping flow rates of the TEOS gas and the O$_2$ gas at 30 sccm and 300 sccm respectively (a flow rate of He gas being at 500 sccm), a flow rate of the C$_2$F$_6$ gas is varied like 0, 50, 125, 175, 225, and 350 sccm. In this case, the applied power is 1.80 W/cm$^2$, the film forming pressure is 5.0 Torr, and the temperature of the mounting table is 400° C. Under these conditions, the SiOF film is deposited to a 200 nm film thickness.

As appreciated from FIG. 13, with the increase in a flow rate of the C$_2$F$_6$ gas, the relative dielectric constant is lowered from about 4.3 to about 3.5 in forming the film. However, if the SiOF film is left as it is in the air for one week, there can be a tendency to increase the relative dielectric constant with the increase in a flow rate of the C$_2$F$_6$ gas. The measured value of 6.2 can be obtained at 350 sccm of the C$_2$F$_6$, so that the relative dielectric constant is increased extremely.

Figure 14:
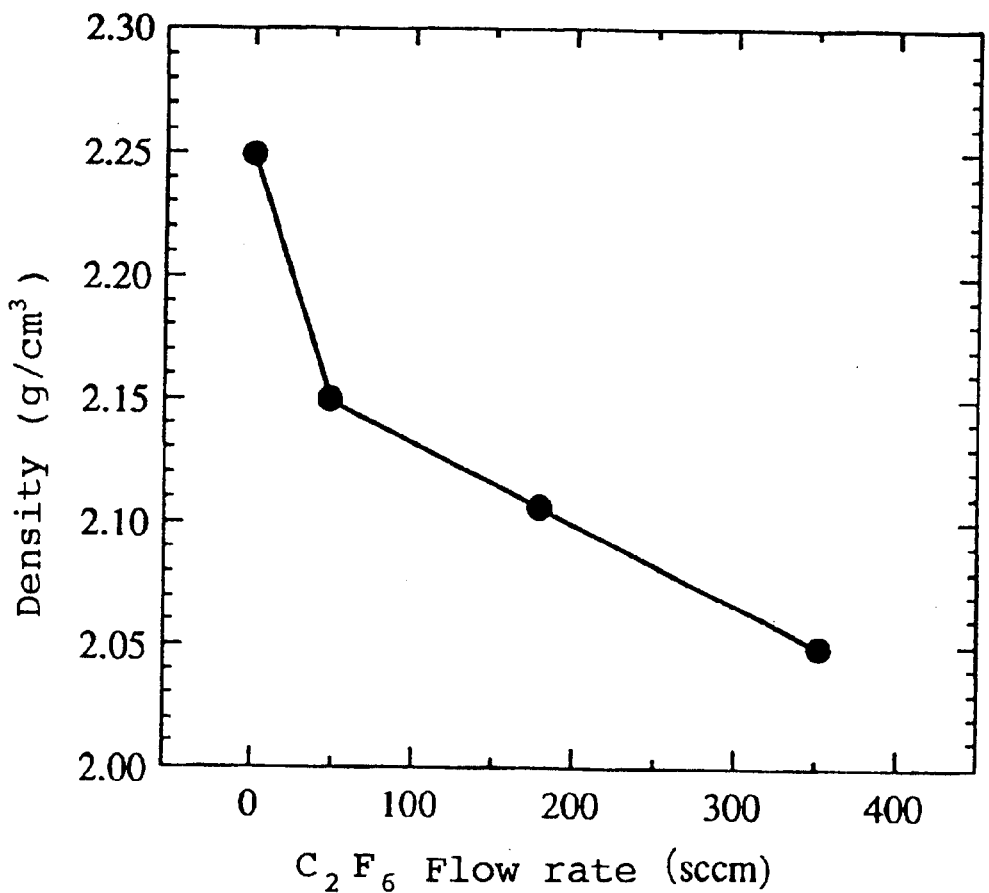
FIG. 14 is a characteristic view showing dependency of a density of an SiOF film upon a $C_2F_6$ gas flow rate as the basis of second to fourth embodiments of the present invention.

By investigating the resultant density of the SiOF film, the density is abruptly reduced from 2.25 g/cm$^3$ to 2.05 g/cm$^3$, as shown in FIG. 14, if a flow rate of the C$_2$F$_6$ gas is increased. It may be presumed from this result that reduction in the density of the SiOF film constitutes a contribution to unstableness of the relative dielectric constant of the SiOF film.

The density may be measured by grazing incidence X-ray reflection (GIXR) wherein an X-ray is irradiated to a sample (i.e., SiOF film) with an incident angle less than several degrees and the density of the sample can then be calculated from reflection strength. The GIXR has an accuracy within 1%.

Detailed reports as for the GIXR have been made in D. K. Bowen and M. Wormington, Advances in X-ray Analysis, Vol.36, p.171, 1993 or L. G. Paratt, Phys. Rev., Vol.95, p.359, 1954.

As to the Si—OH bond, the SiO$_2$ film and the SiOF film are compared with each other by infrared absorption spectra. The comparison result is shown in FIG. 15.

Flow rates of respective reaction gases required for forming the SiOF film are TEOS:O$_2$:C$_2$F$_6$=30 sccm:300 sccm:210 sccm, and other conditions are the same as the case in FIG. 13. The film is then deposited to a 600 nm film thickness. In the case of the SiO$_2$ film, flow rates of respective reaction gases to form the SiO$_2$ film are TEOS:O$_2$=30 sccm:300 sccm, and other conditions are the same as the case as for the SiOF film.

Figure 15:
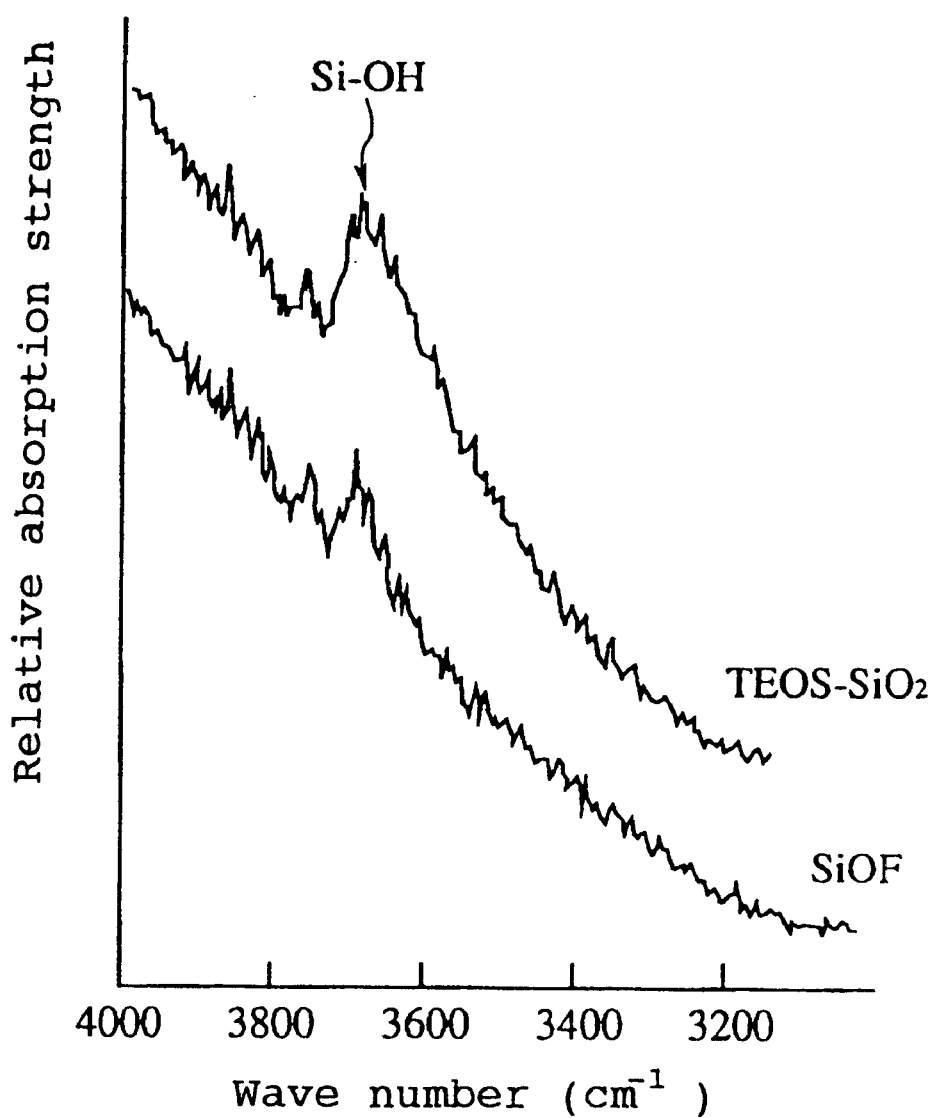
FIG. 15 is a characteristic view showing infrared absorption spectra representing Si—OH bonds in an SiOF film and a TEOS—$SiO_2$ film as the basis of second to fourth embodiments of the present invention.

According to the measurement result, as shown in FIG. 15, the peak appearing near 3700 cm$^{-1}$ corresponds to the Si—OH bond. As can be seen from the absorption strength, the SiO$_2$ film includes more Si—OH bonds therein than the SiOF film.

However, since as known conventionally in the art the humidity absorption of the SiO$_2$ film is significantly lower than that of the SiOF film, it may be considered that the Si—OH bond hardly contributes to unstableness of the relative dielectric constant of the SiOF film.

Next, shown in TABLE I is results of amount of unpaired electrons of Si and C residing in the film, which are measured by electron-spin resonance (ESR).

An amount of Si unpaired electrons represents amount of Si bond defects, while an amount of Si unpaired electrons represents amount of C as impurity.

Although film forming conditions in this event are identical to the case in FIG. 15, both film thicknesses of the SiO$_2$ film and the SiOF film are 1 μm.

TABLE I

| FILM NAME | SI UNPAIRED ELECTRON (1/cm$^3$) | C UNPAIRED ELECTRON (1/cm$^3$) |
| --- | --- | --- |
| SiO$_2$ film | 8.2 × 10$^{17}$ | 6.0 × 10$^{18}$ |
| SiOF film | 2.0 × 10$^{17}$ | 1.8 × 10$^{18}$ |

As may be evident from TABLE I, in the SiOF film, Si unpaired electron density and C unpaired electron density are respectively 2.0×10$^{17}$ cm$^{-3}$ and 1.8×10$^{18}$ cm$^{-3}$. On the other hand, in the SiO$_2$ film, Si unpaired electron density and C unpaired electron density are respectively 8.2×10$^{17}$ cm$^{-3}$ and 6.0×10$^{18}$ cm$^{-3}$.

It may be concluded, as apparent from this result, that the SiO$_2$ film having less humidity absorption than the SiOF film includes more Si unpaired electron density and C unpaired electron density, i.e., more Si bond defects and C impurity than the SiOF film. This leads to the conclusion that unstableness of the relative dielectric constant of the SiOF film is seldom affected by amount of Si bond defects and impurity C.

From the foregoing description, as for the SiOF film and the SiO$_2$ film, respective contributions of reduction in density of the film, presence of Si—OH bonds, Si bond defects and presence of impurity C to humidity absorption have been checked, and as a result it may be recognized that the cause for humidity absorption in the film is reduction in density of the film.

To achieve the SiOF film having low relative dielectric constant and low humidity absorption, a film forming method for controlling the density of the SiOF film is therefore needed.

Humidity absorption of the film has been often examined conventionally by Fourier transform infrared absorption spectra (FTIR) and degassing analysis (TDS analysis)(see Takashi Fukuda and Takashi Akahori, DUMIC Conference February 21–22, p.43–49, 1995, or Tetsuo Matsuda, M. J. Shapiro and Son V. Nguyen, DUMIC Conference February 21–22, p.22–28, 1995). But it is difficult to know variation in the relative dielectric constant because these methods have merely low sensitivity.

Next, the second to fourth embodiment will be explained with reference to FIGS. 15 to 20 wherein the relative dielectric constant is stabilized by changing film forming conditions to control the density of the SiOF film while measuring a change with the passage of time of the relative dielectric constant.

First, in the second embodiment of the present invention, TEOS is used as the Si supply source, and C$_2$F$_6$ is used as the fluorine supply source, and O$_2$ is used as the oxygen supply source. Keeping flow rates of the TEOS gas and the C$_2$F$_6$ gas at 30 sccm and 210 sccm respectively (a flow rate of He gas being at 500 sccm), a flow rate of the O$_2$ gas is varied like 200, 400, 600, and 800 sccm. Under respective conditions, the SiOF film is deposited to a 200 nm film thickness.

At this time, the applied power is 1.80 W/cm$^2$, the film forming pressure is 5.0 Torr, and the temperature of the mounting table is 400° C. Under these conditions, a film forming rate is in the range from 240 to 270 nm/min.

Figure 16:
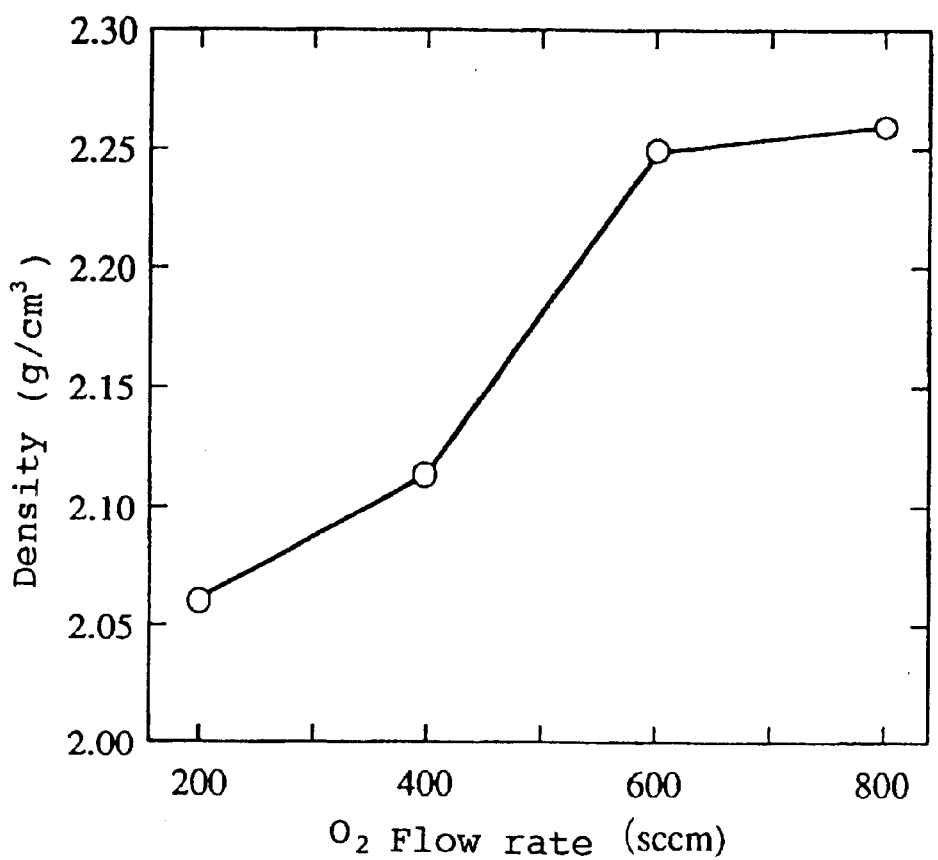
FIG. 16 is a characteristic view showing dependency of a density of an SiOF film upon an $O_2$ gas flow rate according to a second embodiment of the present invention.

As appreciated from FIG. 16, the density of the SiOF film is increased with the increase in a flow rate of the O$_2$ gas. The increase in the density becomes gentle when the flow rate of the O$_2$ gas is beyond 600 sccm. Although not shown in FIG. 16, the increase of the density could not be found even if the flow rate of the O$_2$ gas is increased more than 800 sccm.

In this experiment, saturation of the increase of the density of the SiOF film commences at the flow rate of the O$_2$ gas of 600 sccm. At that time, the resultant density of the SiOF film is 2.25 g/cm$^3$. An upper limit of the density of the resultant SiOF film can be obtained at 800 sccm, and the density of the film at that time is almost 2.26 g/cm$^3$.

Figure 17:
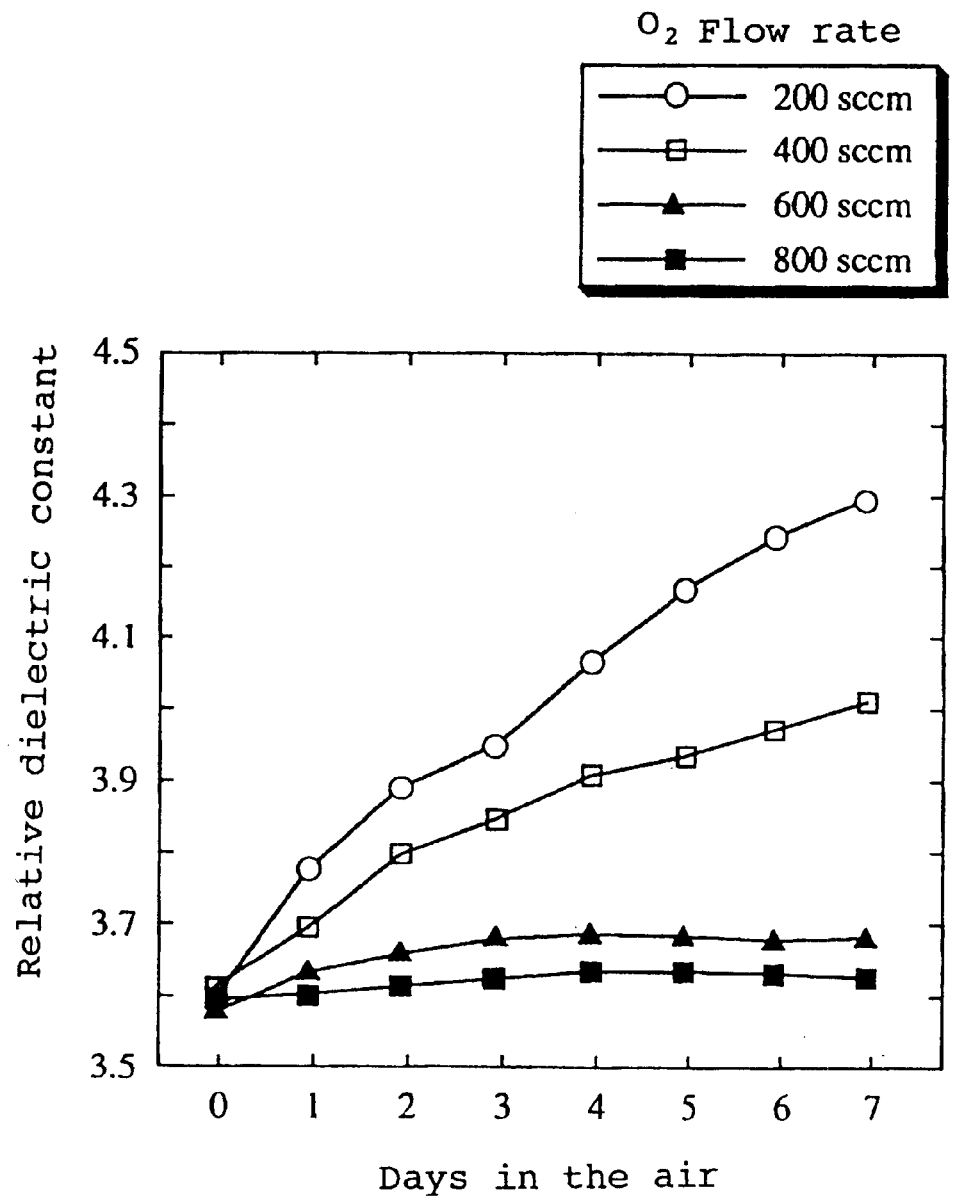
FIG. 17 is a characteristic view showing dependency of a change with the passage of time of a relative dielectric constant of an SiOF film upon an $O_2$ gas flow rate according to the second embodiment of the present invention.

FIG. 17 shows dependency of a change with the passage of time of the relative dielectric constant of the SiOF film upon an O$_2$ gas flow rate when the SiOF film obtained in FIG. 16 is left in the air. In the event that the flow rate of the O$_2$ gas is less than 400 sccm, the relative dielectric constant of the SiOF film being about 3.6 at the time of film forming is increased more than 4.0 after the film has been left for seven days. On the contrary, if the flow rate of the O$_2$ gas is more than 600 sccm, the relative dielectric constant of the SiOF film is 3.7 or less and is hardly changed after the film has been left for seven days.

Consequently, the condition not to provide a large change with the passage of time of the relative dielectric constant is the flow rate of the O$_2$ gas of more than 600 sccm, in other words, the density of the SiOF film of more than 2.25 g/cm$^3$.

Then, referring to FIGS. 17 and 18, the third embodiment of the present invention will be explained. SiH$_4$ is used as the Si supply source, and SiH$_2$F$_2$ is used as the fluorine supply source, and N$_2$O is used as the oxygen supply source. In this event, SiH$_2$F$_2$ serving as the fluorine supply source is also used as Si supply source.

Keeping flow rates of the reaction gases supplied upon forming the film are SiH$_4$:SiH$_2$F$_2$=6 sccm:6 sccm respectively, a flow rate of the N$_2$O gas is varied like 600, 1200, 1500, 1800 and 2000 sccm. Under respective conditions, the SiOF film is deposited to a 200 nm film thickness.

At this time, the applied power is 1.80 W/cm$^2$, the film forming pressure is 5.0 Torr, and the temperature of the mounting table is 400° C. The film forming rate is in the range from 110 to 170 nm/min.

Figure 18:
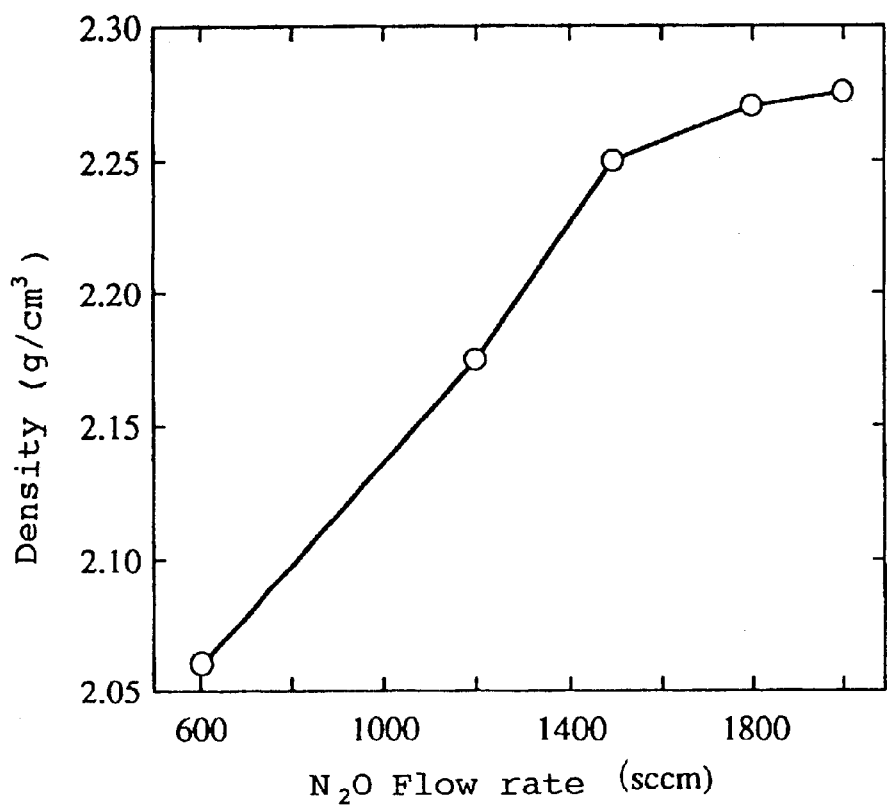
FIG. 18 is a characteristic view showing dependency of a density of an SiOF film upon an $N_2O$ gas flow rate according to a third embodiment of the present invention.

As may be evident from FIG. 18, the density of the SiOF film is increased in proportion to the increase in a flow rate of the N$_2$O gas. The increase in the density is begun to saturate when the flow rate of the O$_2$ gas is in excess of 1500 sccm. At that time, the resultant density of the SiOF film is 2.25 g/cm$^3$. An upper limit of the density of the resultant SiOF film can be guessed about 2.27 g/cm³ from the tendency of FIG. 18.

Figure 19:
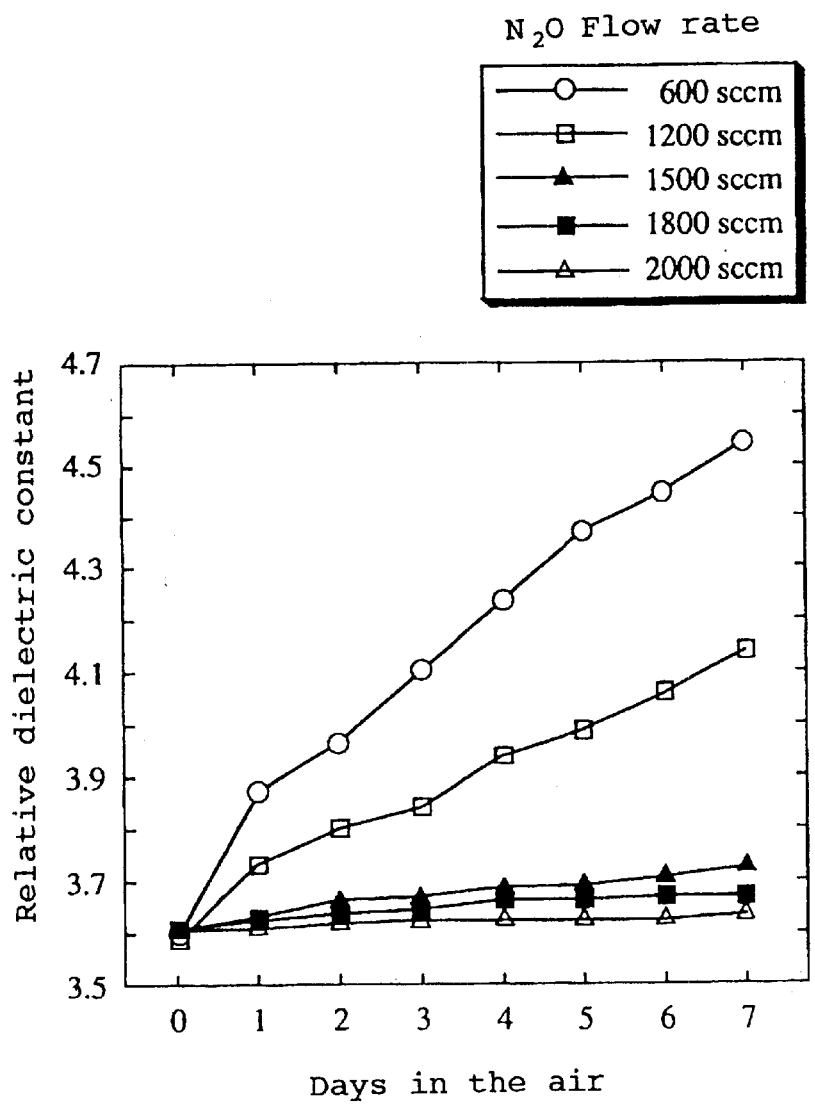
FIG. 19 is a characteristic view showing dependency of a change with the passage of time of a relative dielectric constant of an SiOF film upon an $N_2O$ gas flow rate according to the third embodiment of the present invention.

FIG. 19 shows dependency of a change with the passage of time of the relative dielectric constant of the SiOF film upon a flow rate of the $N_2O$ gas when the SiOF film obtained in FIG. 18 is left in the air. In the event that the flow rate of the $N_2O$ gas is less than 1200 sccm, the relative dielectric constant of the SiOF film being about 3.6 at the time of film forming is increased more than 4.1 after the film has been left for seven days. On the other hand, if the flow rate of the $N_2O$ gas is more than 1500 sccm, the relative dielectric constant of the SiOF film is 3.75 or less and is hardly changed after the film has been left for seven days.

Consequently, the condition not to provide a large change with the passage of time of the relative dielectric constant is the flow rate of the $N_2O$ gas of more than 1500 sccm, that is, the density of the SiOF film of more than 2.25 g/cm³, which results in the same result as in the second embodiment.

Finally, referring to FIGS. 19 and 20, the fourth embodiment of the present invention will be explained wherein $SiH_4$ is used as the Si supply source, and $SiF_4$ is used as the fluorine supply source, and $N_2O$ is used as the oxygen supply source. It would be presumed that, although $SiF_4$ as the fluorine supply source in this case also includes Si like the third embodiment, $SiF_4$ cannot serve substantially as the Si supply source since it has bad decomposition efficiency in plasma to result in low probability of becoming Si because of detaching all four fluorine and since it also serves as the etching gas.

While maintaining flow rates of the $SiH_4$ gas and the $SiF_4$ gas at 6 sccm and 160 sccm respectively, a flow rate of the $N_2O$ gas is varied like 800, 1300, 1600, and 1900 sccm. Under respective conditions, the SiOF film is deposited to a 200 nm film thickness.

At this time, the applied power is 1.80 W/cm², the film forming pressure is 5.0 Torr, and the temperature of the mounting table is 400° C. Under these conditions, a film forming rate is in the range from 100 to 132 nm/min.

Figure 20:
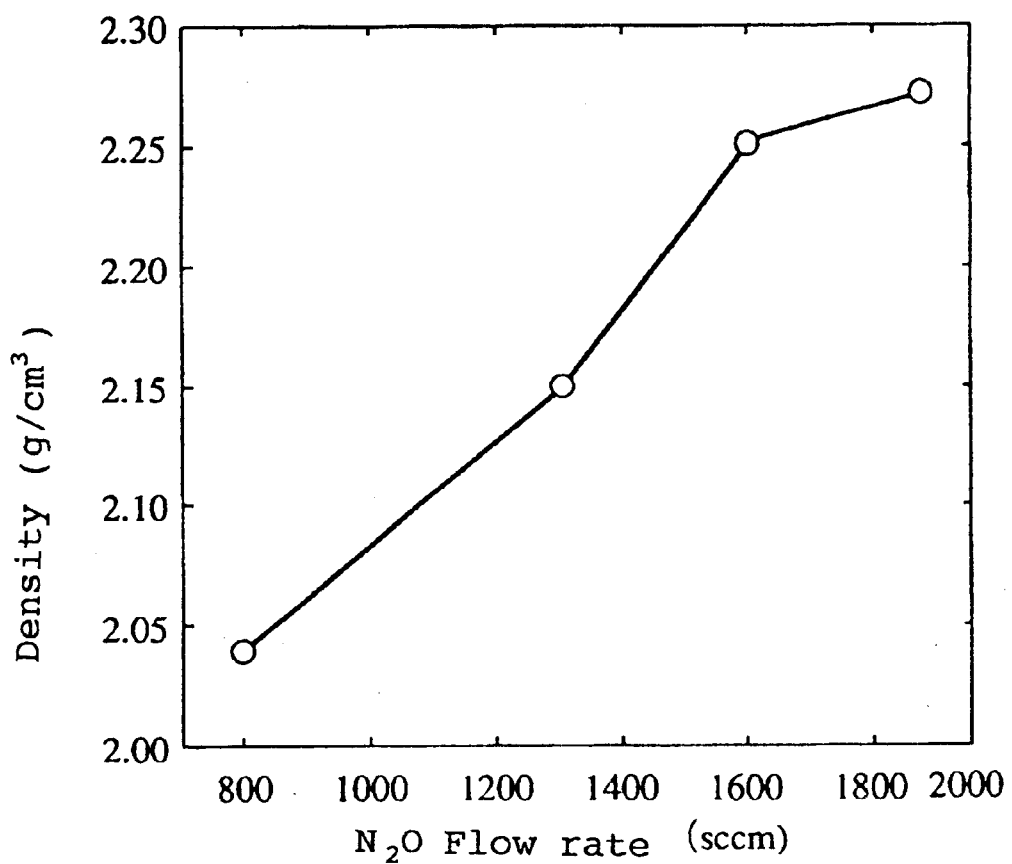
FIG. 20 is a characteristic view showing dependency of a density of an SiOF film upon an $N_2O$ gas flow rate according to a fourth embodiment of the present invention.

As is clear from FIG. 20, the density of the SiOF film is increased with the increase in a flow rate of the $N_2O$ gas. The tendency of saturation appears in the increase in the density when the flow rate of the $O_2$ gas is beyond 1600 sccm. At that time, the resultant density of the SiOF film is 2.25 g/cm³, and an upper limit of the density of the resultant SiOF film can be presumed as almost 2.27 g/cm³.

Figure 21:
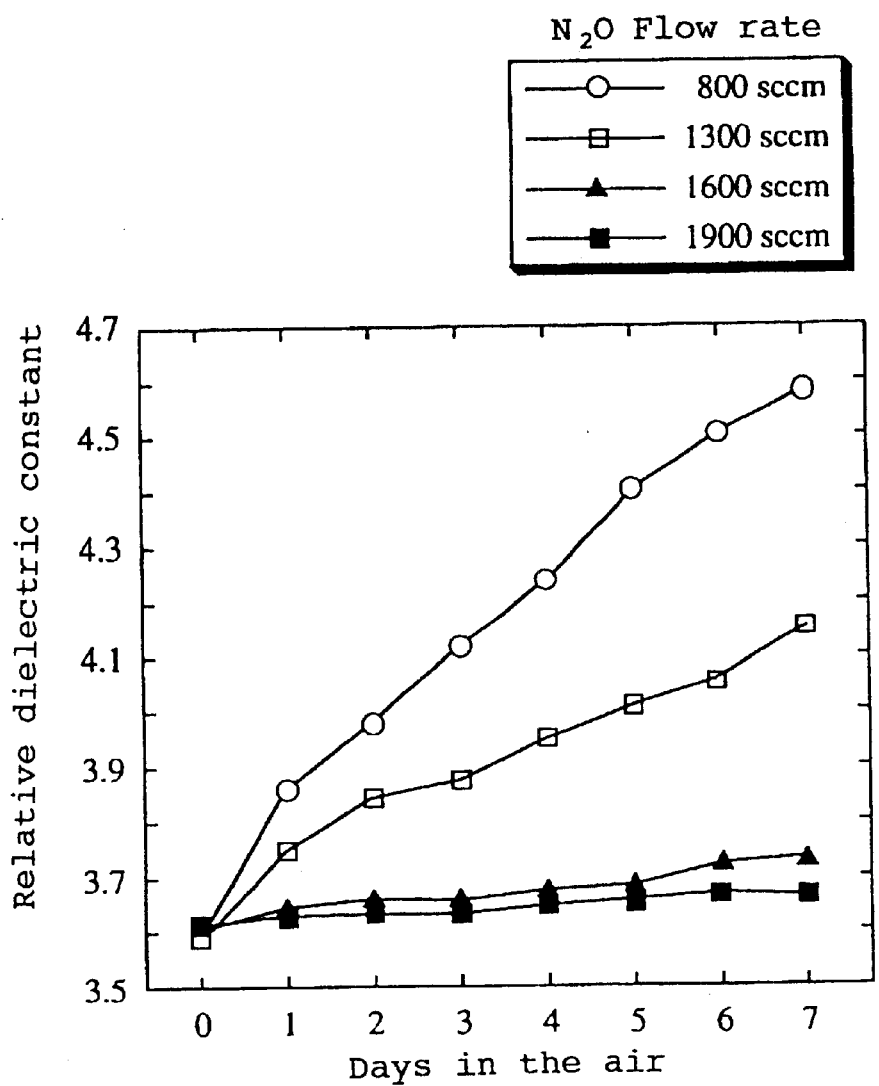
FIG. 21 is a characteristic view showing dependency of a change with the passage of time of a relative dielectric constant of an SiOF film upon a $N_2O$ gas flow rate according to the fourth embodiment of the present invention.

FIG. 21 shows dependency of a change with the passage of time of the relative dielectric constant of the SiOF film upon an $O_2$ gas flow rate when the SiOF film obtained in FIG. 20 is left in the air. In the event that the flow rate of the $N_2O$ gas is less than 1300 sccm, the relative dielectric constant of the SiOF film being about 3.6 at the time of film forming is increased more than 4.1 after the film has been left for seven days. On the contrary, if the flow rate of the $N_2O$ gas is more than 1600 sccm, the relative dielectric constant of the SiOF film is 3.75 or less and is hardly changed after the film has been left for seven days.

With the above, the condition not to provide a large change with the passage of time of the relative dielectric constant is the flow rate of the $N_2O$ gas of more than 1600 sccm, i.e., the density of the SiOF film of more than 2.25 g/cm³, which yields the same results as the second and third embodiments.

If all the above second to fourth embodiments are considered totally, the condition to obtain the SiOF film which has a low relative dielectric constant such as about 3.6 and is stable in time is that the density of the resultant SiOF film must be more than 2.25 g/cm³ regardless of kinds of material gas. To obtain such film, it would be understood that the amount of gas as the oxygen supply source may be set larger than a predetermined amount in respective reaction systems.

As appreciated from FIGS. 15 to 20, under the film forming condition wherein the density of the SiOF film is more than 2.25 g/cm³, the amount of the gas as the oxygen supply source may be set larger than a predetermined amount. In this event, the density of the film and the change with the passage of time scarcely change. As a result, manufacturing conditions must not be always controlled strictly to thus yield easy manufacturing.

In the above second to fourth embodiments, the film has been formed under the condition where the flow rate of Si supply gas and fluorine supply gas are kept constant. Conditions being predictable from various experiments to obtain the SiOF film having good characteristics under other same conditions have been adopted as these conditions. Particularly, although the conditions in the second embodiment have been determined from the conditions which enable the SiOF film having good characteristics to be achieved in the proposal (Patent Application No. 7-29137) made by the inventors of the present invention, the present invention is not limited to such flow rate. It should be noted that such film forming conditions may be adopted to meet the fact that the density of the resultant film is more than 2.25 g/cm³ and the relative dielectric constant in forming the film is near 3.6.

In this case, as evidenced by FIGS. 12 and 13, if the flow rate of the fluorine supply gas is increased for the flow rate of the Si supply gas, the relative dielectric constant becomes low on forming the film. But the change with the passage of time of the relative dielectric constant is increased to become identical substantially to that of TEOS—$SiO_2$ finally, and the density of the film is also lowered.

Accordingly, from the view point of stability of the change with the passage of time of the relative dielectric constant, it may be readily presumed that a ratio of the flow rate of the fluorine supply gas for that of the Si supply gas has its upper limit. Nevertheless, the SiOF film being stable in a elapsed time characteristic cannot be achieved in case the flow amount of the fluorine supply gas is too much and as a result the relative dielectric constant in forming the film is near 3.5.

On the contrary, it may be supposed as evidenced by FIGS. 12 and 13 that, if the flow rate of the fluorine supply gas for that of the Si supply gas is lessened, the relative dielectric constant in forming the film is high although the change with the passage of time of the relative dielectric constant becomes relatively stable, and therefore the SiOF film of less than 3.75 cannot be obtained finally. It is of course that, because there is no merit to use such SiOF film having relatively high relative dielectric constant as the interlayer insulating film of the ultra high density semiconductor integrated circuit device, a lower limit of the fluorine supply gas for that of the Si supply gas resides, i.e., an upper limit of the relative dielectric constant in forming the film resides.

As a result, as the condition to obtain the SiOF film which has a relative dielectric constant within a practical range and stable in time, the density of the resultant SiOF film must be more than 2.25 g/cm³ and the relative dielectric constant in forming the film must be near 3.6. However, note that the relative dielectric constant at the time of forming the film may be slightly apart from 3.6 within the tolerance according to purposes of use.

Fifth Embodiment

Figure 22:
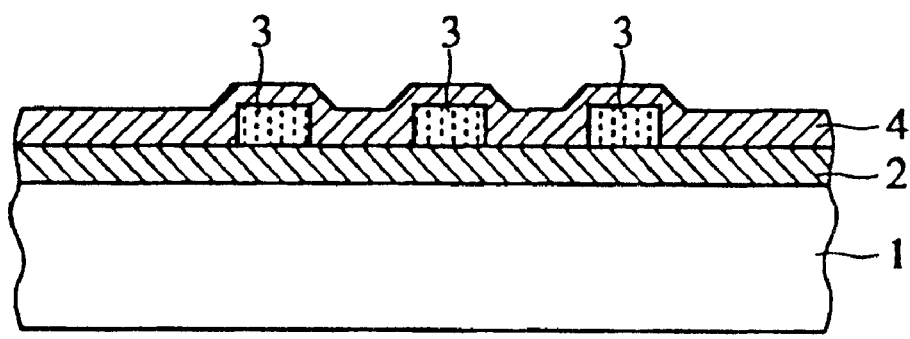
FIG. 22 is a fragmental sectional view exemplifying a semiconductor device having an interlayer insulating film formed by a method for forming a fluorine type resin film according to the present invention.

FIG. 22 is a sectional view exemplifying a semiconductor device having an interlayer insulating film formed by a method for forming a fluorine type resin film according to a fifth embodiment of the present invention. In FIG. 22, a reference 1 denotes a semiconductor substrate; 2, base insulating layer; 3, interconnection layer; and 4, fluorine type resin film.

Next, a fifth embodiment of the present invention will be explained with reference to FIGS. 22 to 30 hereinbelow.

Figure 23:
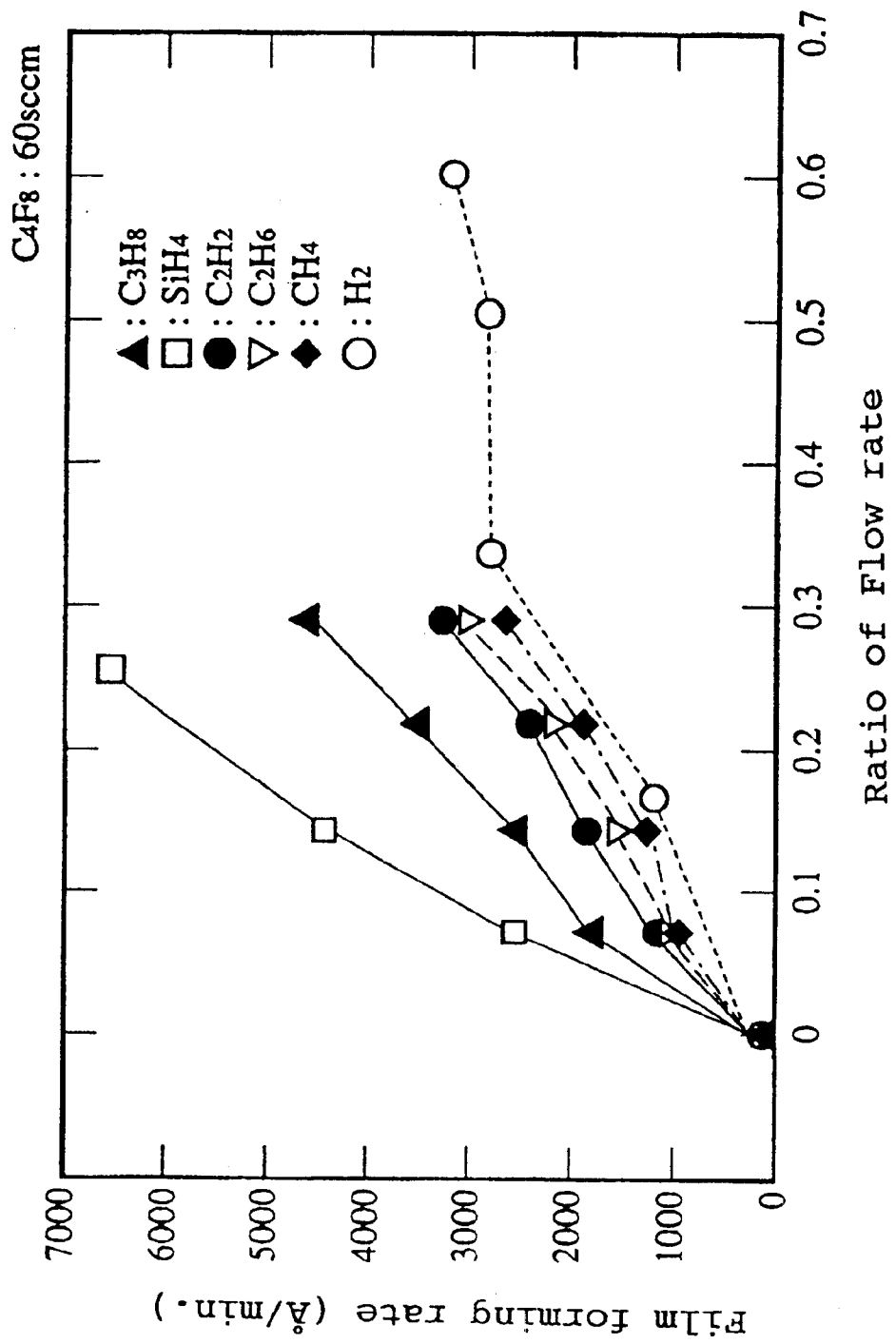
FIG. 23 is a characteristic view showing dependency of a film forming rate of a fluorine type resin film upon a ratio of a hydrogen containing compound gas flow rate for $C_4F_8$ gas according to a fifth embodiment of the present invention.

FIG. 23 shows dependency of a film forming rate of a fluorine type resin film upon a ratio of a hydrogen containing compound gas flow rate for $C_4F_8$ gas according to a fifth embodiment of the present invention in case $C_4F_8$ having a carbon (C)/fluorine (F) composition ratio (referred to as a C/F ratio hereinafter) of 1/2 is used as fluorocarbon gas and $H_2$, $SiH_4$, $C_2H_2$, $C_3H_8$, $C_2H_6$ or $CH_4$ is used as the hydrogen containing compound gas.

The hydrogen containing compound gas is diluted by He. A degree of dilution is that the hydrogen containing compound gas (sccm): He gas (sccm)=1:9 in a ratio of flow rate. The ratio of flow rate in FIG. 23 is defined as a ratio of actual flow rate of the hydrogen containing compound gas to the flow rate of $C_4F_8$, which is true of the following experiments similarly. Since He may be regarded to have no influence on the plasma reaction, it seems that the degree of dilution raises no problem.

In this case, the flow rate of $C_4F_8$ is 60 sccm, the pressure for forming the film is 1.2 Torr, the temperature for forming the film is 250° C., and the applied power is 0.59 W/cm$^2$.

Under the above conditions, the film has been formed by the CCP-plasma CVD method using the parallel plate type plasma CVD equipment (CCP-plasma CVD equipment).

As may be evident from FIG. 23, with the increase in the flow rate ratio of the hydrogen containing compound gas to $C_4F_8$, the film forming rate is increased. The reason may be supposed that a rate of fluorine trapped in hydrogen is increased in proportion to the increase in the flow rate ratio of the hydrogen containing compound gas to thus decrease etching action of fluorine radical.

$SiH_4$ has the largest film forming rate in the hydrogen containing compound gas, and the film forming rate is increased with increase in molecular weight in hydrocarbon, except for $C_2H_2$. The following is the reason of this fact. That is, in the case of the hydrocarbon having neither double bond nor triple bond therein, the film forming rate depends on the molecular weight, while, in the case of $C_2H_2$ having triple bond therein, the film forming rate shows different tendency from that of the hydrocarbon having neither double bond nor triple bond.

When the film is formed under the above conditions, there is no possibility that Si is included substantially in the fluorine type resin film even if $SiH_4$ is used as the hydrogen containing compound gas.

Figure 24:
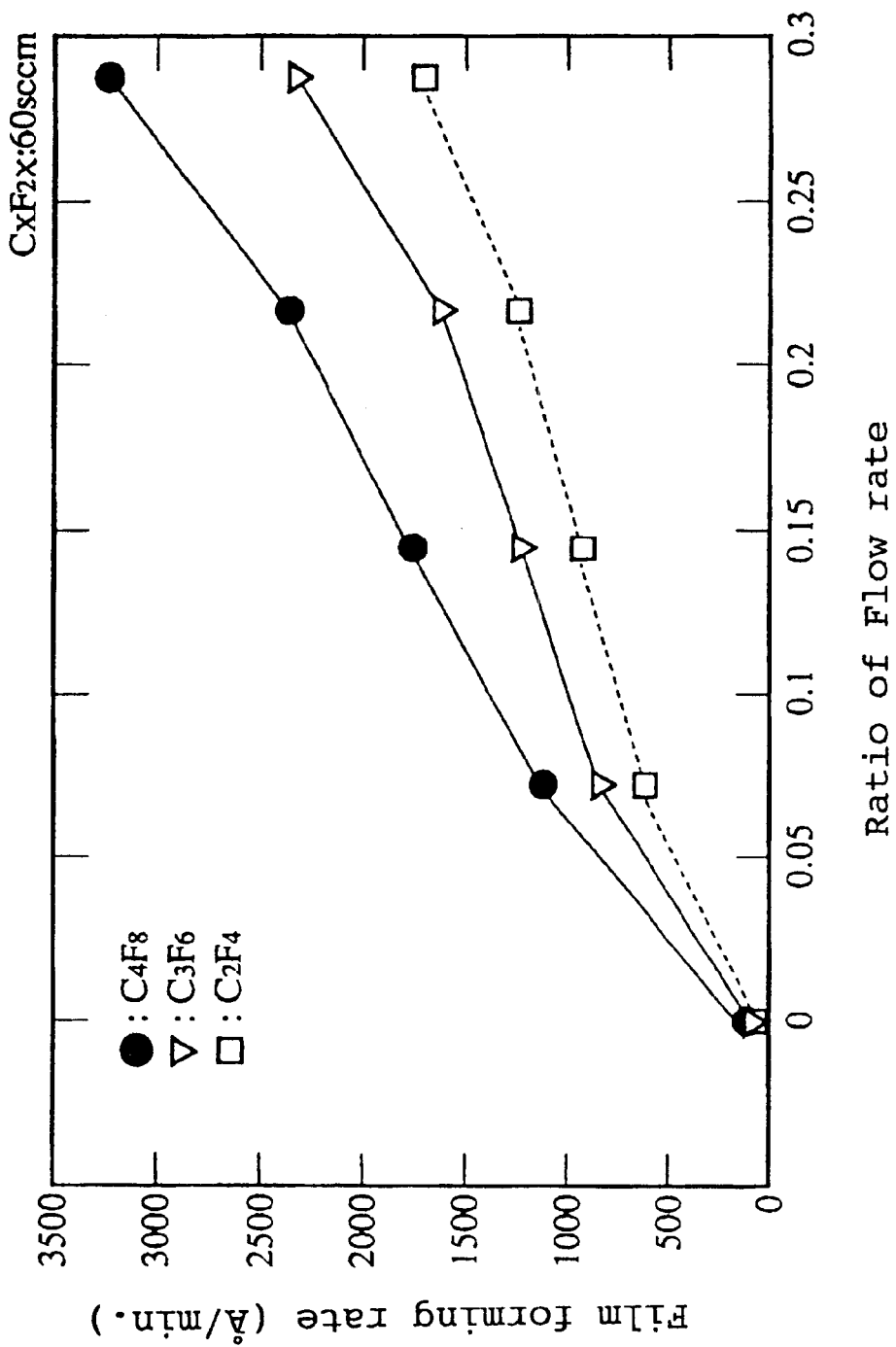
FIG. 24 is a characteristic view showing dependency of a film forming rate of a fluorine type resin film upon a ratio of $C_2H_2$ gas flow rate for fluorocarbon gas according to the fifth embodiment of the present invention.

FIG. 24 shows dependency of a film forming rate of a fluorine type resin film upon a ratio of $C_2H_2$ gas flow rate for fluorocarbon ($C_xF_{2x}$) gas in case $C_2H_2$ is used as the hydrogen containing compound gas and $C_2F_4$, $C_3F_6$, or $C_4F_8$ having a C/F ratio of 1/2 is used as fluorocarbon gas.

In this case, the flow rate of fluorocarbon ($C_xF_{2x}$) is 60 sccm, the pressure for forming the film is 1.2 Torr, the temperature for forming the film is 250° C., and the applied power is 0.59 w/cm$^2$. Under the above conditions, the film has been formed by the CCP-plasma CVD method.

As evidenced by FIG. 24, like FIG. 23, with the increase in the flow rate ratio of $C_2H_2$ to fluorocarbon ($C_xF_{2x}$), the film forming rate is increased. Especially, $C_4F_8$ has the largest film forming rate in the hydrogen containing compound gas, and there can be seen such tendency that the film forming rate is increased with increase in molecular weight.

Figure 25:
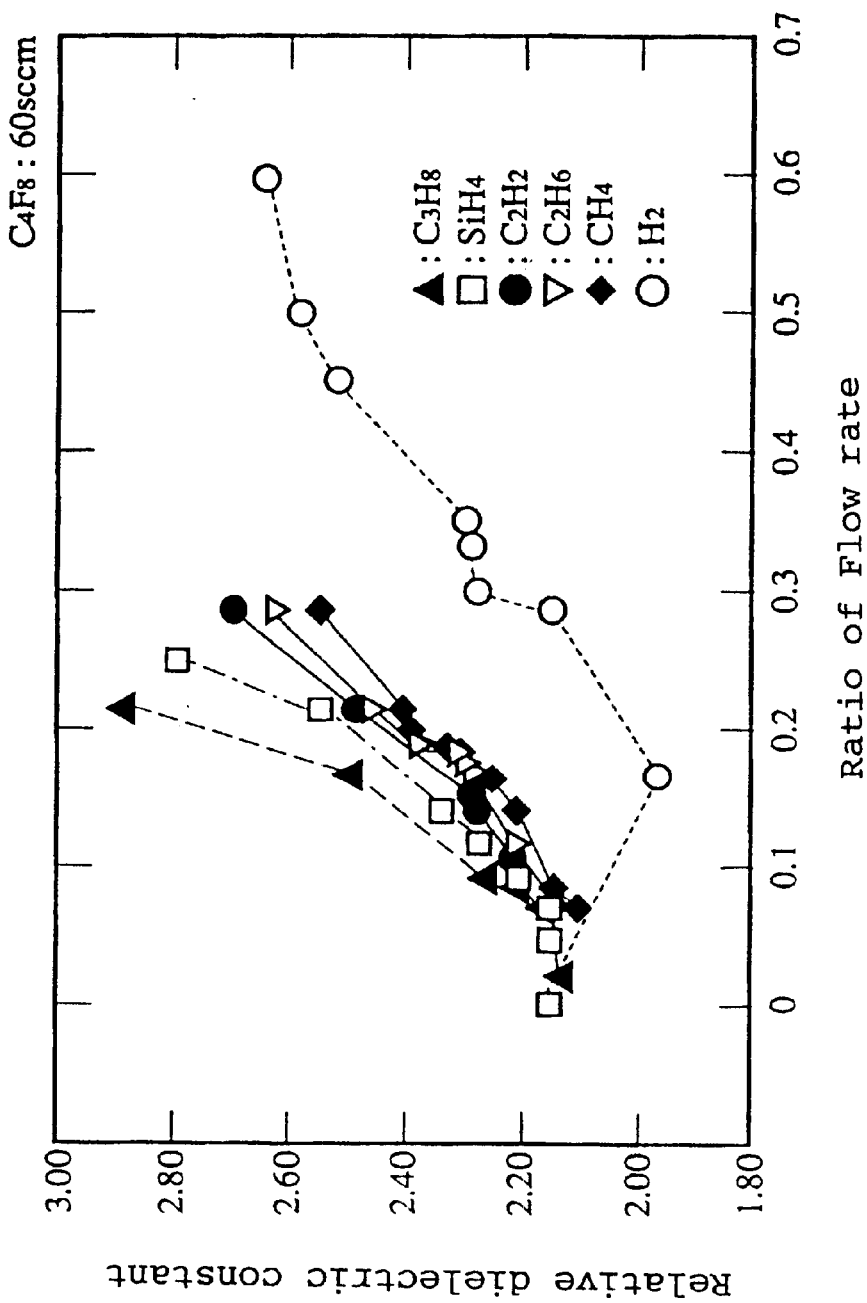
FIG. 25 is a characteristic view showing dependency of a relative dielectric constant of a fluorine type resin film upon a ratio of a hydrogen containing compound gas flow rate for $C_4F_8$ gas according to the fifth embodiment of the present invention.

FIG. 25 showing dependency of a relative dielectric constant of a fluorine type resin film upon a ratio of a hydrogen containing compound gas flow rate for $C_4F_8$ gas in case $C_4F_8$ is used as fluorocarbon and $H_2$, $SiH_4$, $C_2H_2$, $C_3H_8$, $C_2H_6$ or $CH_4$ is used as the hydrogen containing compound gas.

In this event, the flow rate of $C_4F_8$ is 60 sccm, the pressure for forming the film is 1.2 Torr, the temperature for forming the film is 250° C., and the applied power is 0.59 W/cm$^2$. Under the above conditions, the film has been formed by the CCP-plasma CVD method.

As may be evident from FIG. 25, with the increase in the flow rate ratio of the hydrogen containing compound gas to $C_4F_8$, the relative dielectric constant is increased. This is because a rate of fluorine trapped in hydrogen is increased in proportion to the increase in the flow rate ratio of the hydrogen containing compound gas, so that an amount of fluorine to be taken in the film is lowered to thus provide a carbon rich film. As a result, the relative dielectric constant is increased according to the increase of carbon.

$C_3H_8$ has the largest increasing tendency of the relative dielectric constant in the hydrogen containing compound gas, and on the contrary the smallest increasing tendency of the relative dielectric constant can be obtained if hydrogen is used.

Figure 26:
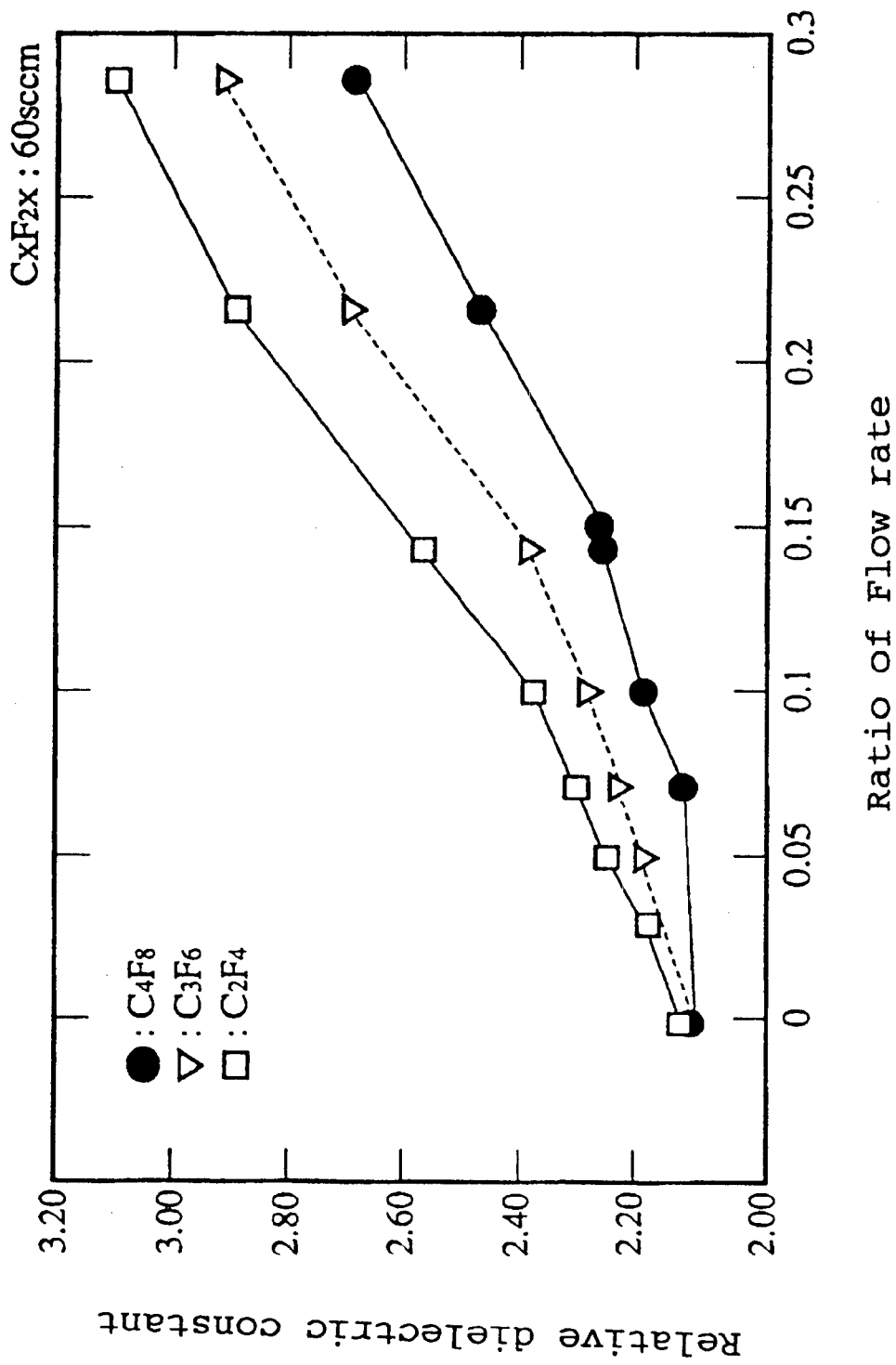
FIG. 26 is a characteristic view showing dependency of a relative dielectric constant of a fluorine type resin film upon a ratio of a $C_2H_2$ gas flow rate for fluorocarbon gas according to the fifth embodiment of the present invention.

FIG. 26 shows dependency of a relative dielectric constant of a fluorine type resin film upon a ratio of a $C_2H_2$ gas flow rate for fluorocarbon ($C_xF_{2x}$) gas in case $C_2H_2$ is used as the hydrogen containing compound gas and $C_2F_4$, $C_3F_6$, and $C_4F_8$ are used as the fluorocarbon gas.

In this case, the flow rate of fluorocarbon ($C_xF_{2x}$) is 60 sccm, the pressure for forming the film is 1.2 Torr, the temperature for forming the film is 250° C., and the applied power is 0.59 W/cm$^2$. Under the above conditions, the film has been formed by the CCP-plasma CVD method.

As may be apparent from FIG. 26, like FIG. 25, with the increase in the flow rate ratio of $C_2H_2$ to fluorocarbon ($C_xF_{2x}$), the relative dielectric constant is increased. In particular, $C_4F_8$ has the smallest increasing tendency of the relative dielectric constant in the hydrogen containing compound gas. The larger molecular weight, the smaller the increasing tendency of the relative dielectric constant.

Figure 27:
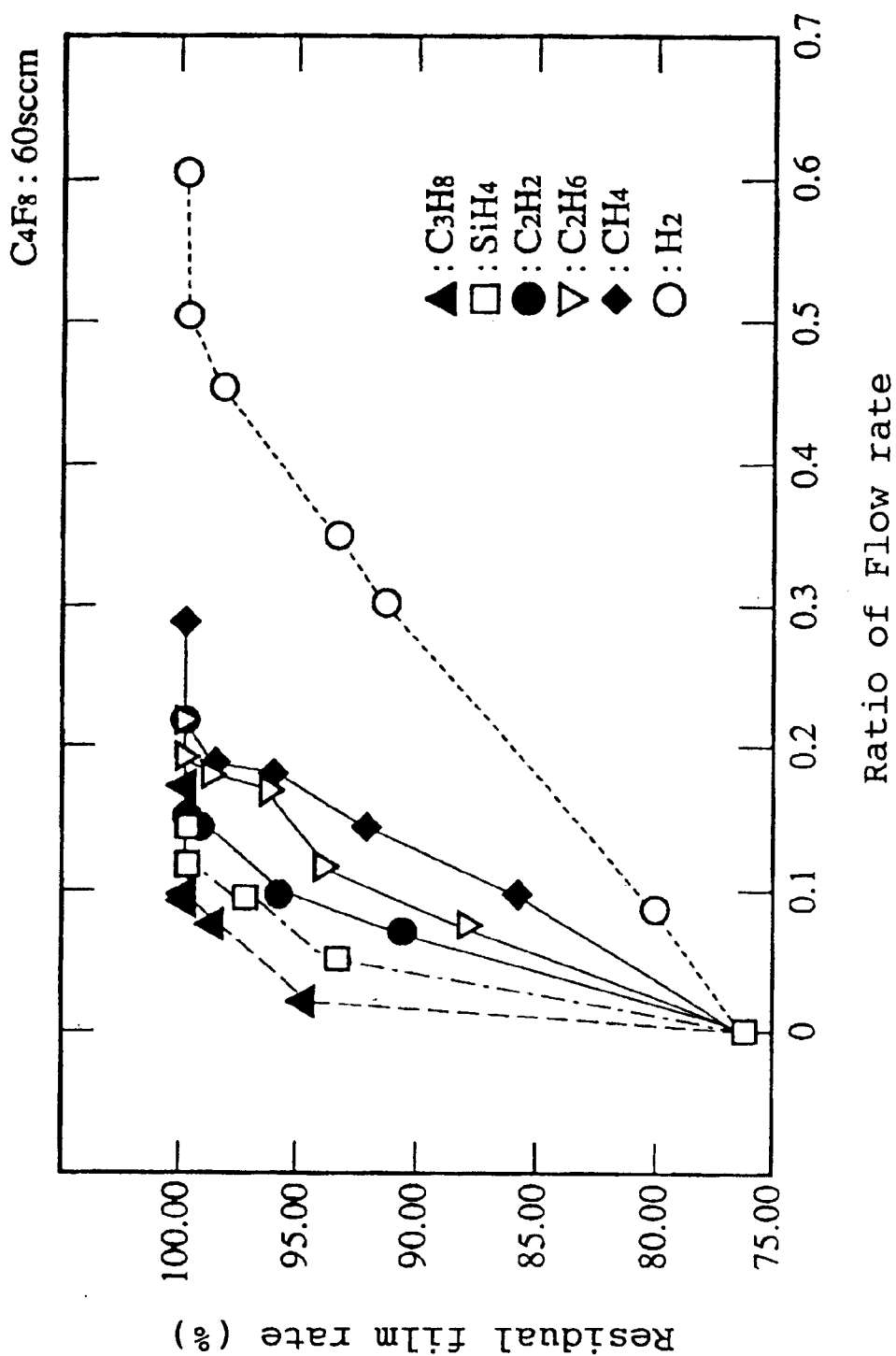
FIG. 27 is a characteristic view showing dependency of a residual film rate of a fluorine type resin film upon a ratio of a hydrogen containing compound gas flow rate for $C_4F_8$ gas according to the fifth embodiment of the present invention.

FIG. 27 shows dependency of a residual film rate of a fluorine type resin film upon a ratio of a hydrogen containing compound gas flow rate for $C_4F_8$ gas in case $C_4F_8$ is used as fluorocarbon gas and $H_2$, $SiH_4$, $C_2H_2$, $C_3H_8$, $C_2H_6$ and $CH_4$ are used as the hydrogen containing compound gas.

In this case, the flow rate of $C_4F_8$ is 60 sccm when forming the film, the pressure for forming the film is 1.2 Torr, the temperature for forming the film is 250° C., and the applied power is 0.59 W/cm$^2$. Under the above conditions, the film has been formed by the CCP-plasma CVD method.

The residual film rate denotes a change in the film thickness of the fluorine type resin film in percentage before and after the film is annealed at 400° C. for ten minutes in a nitrogen atmosphere of normal pressure. Not a heater temperature but a temperature of the fluorine type resin film per se is given by the annealing temperature.

As may be evident from FIG. 27, with the increase in the flow rate ratio of the hydrogen containing compound gas to $C_4F_8$, there can be seen the tendency that the residual film ratio is increased, i.e., heat resistance can be improved. The reason is as follows. That is, a rate of fluorine trapped in hydrogen is increased in proportion to the increase in the flow rate ratio of the hydrogen containing compound gas, so that an amount of fluorine to be taken in the film is lowered. Therefore, the carbon rich film having high bridging density and large molecular weight can be obtained so that large moleculars become difficult to be emitted from the film when the substrate is heated. As for the kinds of the hydrogen containing compound gas, the substantially same tendency as those of the film forming rate and the relative dielectric constant can be found.

Figure 28:
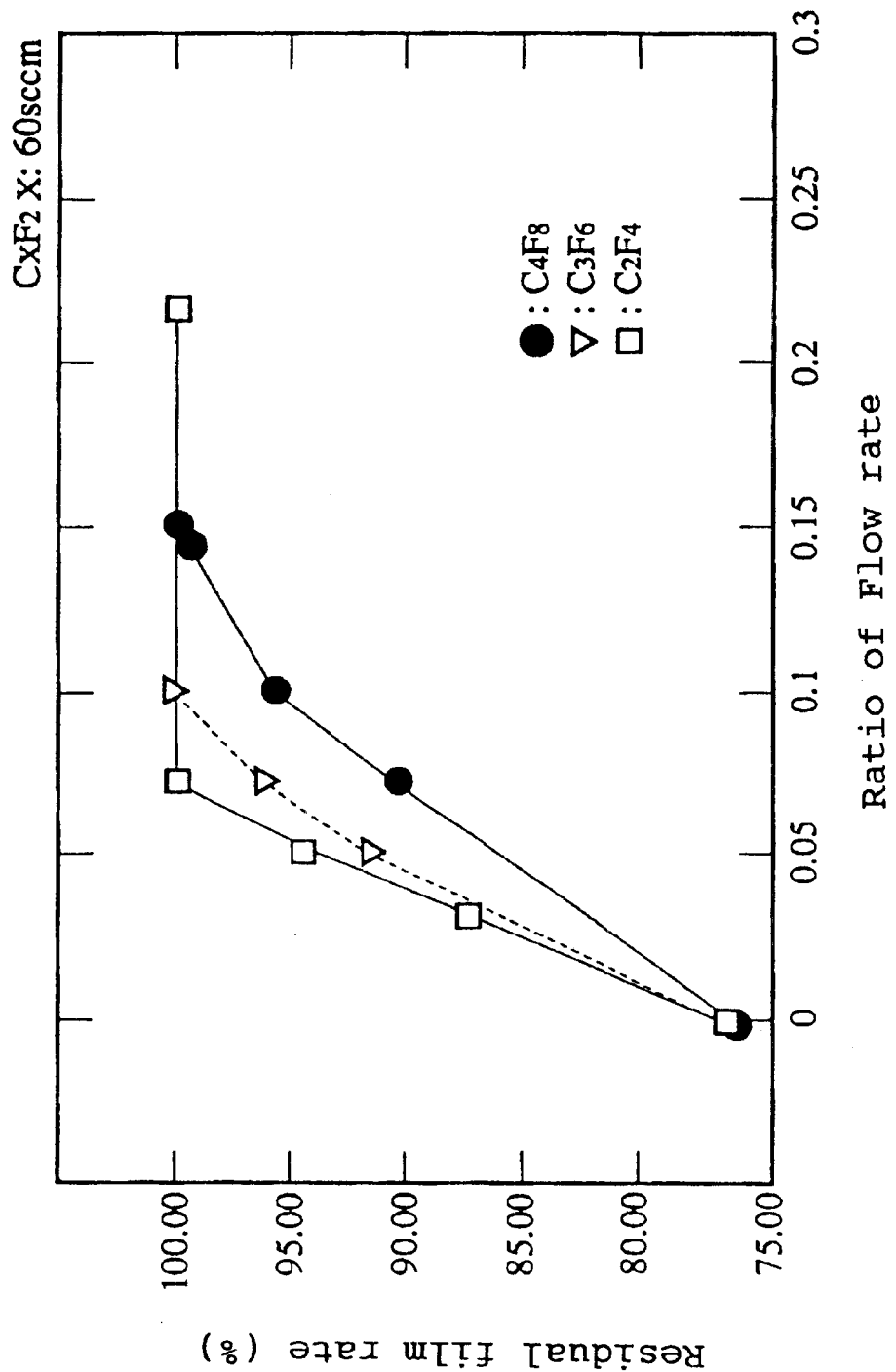
FIG. 28 is a characteristic view showing dependency of a residual film rate of a fluorine type resin film upon a ratio of a $C_2H_2$ gas flow rate for fluorocarbon gas according to the fifth embodiment of the present invention.

FIG. 28 shows dependency of a residual film rate of a fluorine type resin film upon a ratio of a $C_2H_2$ gas flow rate for fluorocarbon ($C_xF_{2x}$) gas in case $C_2H_2$ is used as the hydrogen containing compound gas and $C_2F_4$, $C_3F_6$ and $C_4F_8$ are used as the fluorocarbon gas.

In this case, the flow rate of fluorocarbon ($C_xF_{2x}$) is 60 sccm, the pressure for forming the film is 1.2 Torr, the temperature for forming the film is 250° C., and the applied power is 0.59 W/cm$^2$. Under the above conditions, the film has been formed by the CCP-plasma CVD method.

The residual film rate also denotes a change in the film thickness of the fluorine type resin film in percentage before and after the film is annealed at 400° C. for ten minutes in a nitrogen atmosphere of normal pressure. Like FIG. 27, with the increase in the flow rate ratio of $C_2H_2$ to fluorocarbon ($C_xF_{2x}$), there can be seen the tendency that the residual film ratio is increased. Especially, $C_2F_4$ has best heat resistance in the fluorocarbon gas. It can be concluded that, if fluorocarbon has smaller molecular weight and has less fluorine, better heat resistance can be achieved.

Figure 29:
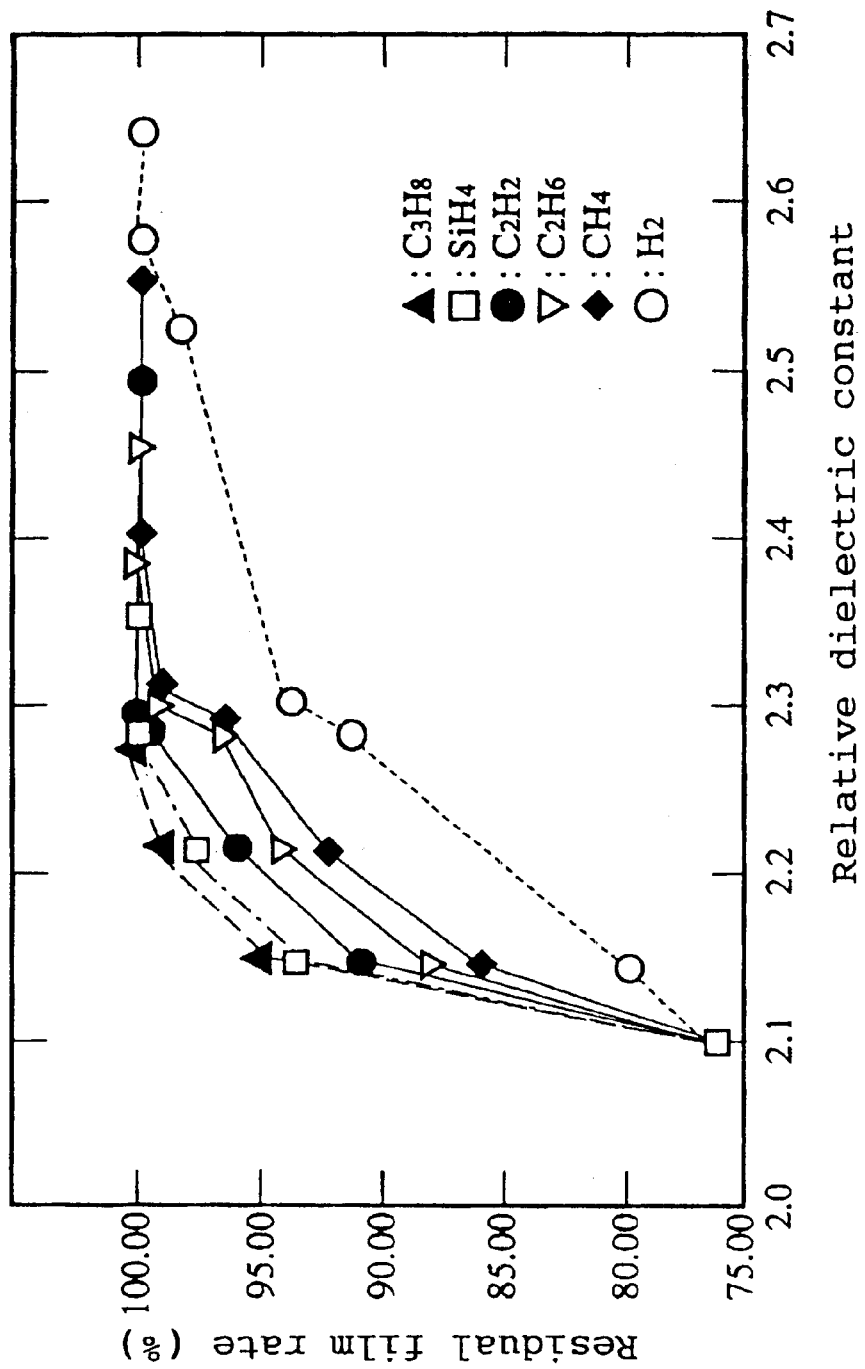
FIG. 29 is a characteristic view showing a relationship between a residual film rate of a fluorine type resin film and relative dielectric constant if a $C_4F_8$ gas is used as a fluorocarbon gas according to the fifth embodiment of the present invention.

FIG. 29 shows a relationship between a residual film rate of a fluorine type resin film and relative dielectric constant in case $C_4F_8$ is used as fluorocarbon gas and $H_2$, $SiH_4$, $C_2H_2$, $C_3H_8$, $C_2H_6$ and $CH_4$ are used as the hydrogen containing compound gas. FIG. 29 has been prepared based on FIGS. 24 and 26.

As evidenced by FIG. 29, the residual film rate is increased with the increase in relative dielectric constant. In any gas, the residual film rate becomes 100% if the relative dielectric constant exceeds a certain value. If $C_3H_8$ is used as the hydrogen containing compound gas, the fluorine type resin film having smallest relative dielectric constant and excellent heat resistance can be obtained. In case $SiH_4$ or $C_2H_2$ is used, the same tendency can be found.

Figure 30:
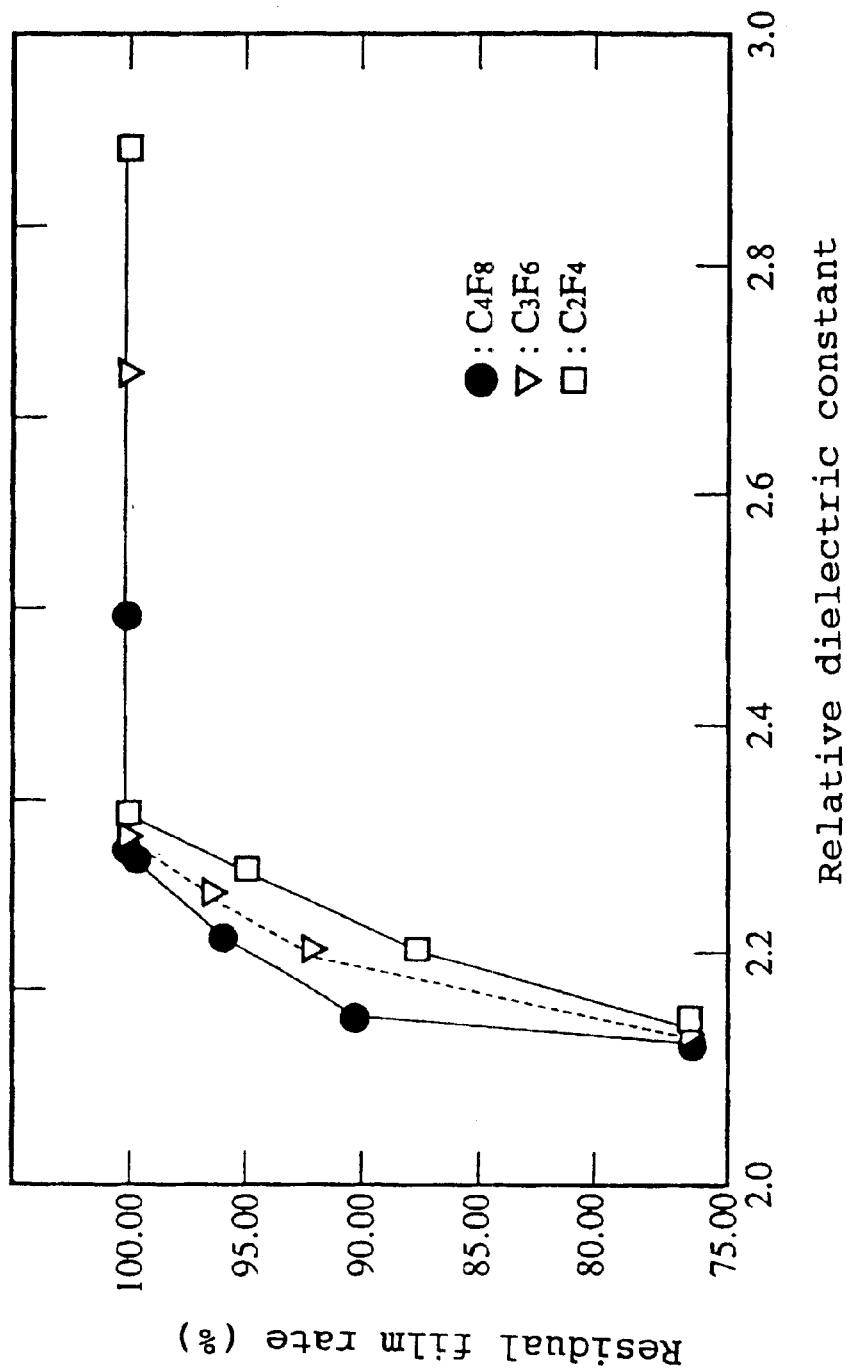
FIG. 30 is a characteristic view showing a relationship between a residual film rate of a fluorine type resin film and relative dielectric constant if a $C_2H_2$ gas is used as a hydrogen containing compound gas according to the fifth embodiment of the present invention.

FIG. 30 shows a relationship between a residual film rate of a fluorine type resin film and relative dielectric constant in case $C_2H_2$ is used as the hydrogen containing compound gas and $C_2F_4$, $C_3F_6$, and $C_4F_8$ are used as the fluorocarbon gas. FIG. 30 has been prepared based on FIGS. 25 and 27.

As may be evident from FIG. 30, the residual film rate is increased with the increase in relative dielectric constant. In any gas, the residual film rate becomes 100% if the relative dielectric constant exceeds a certain value. Especially, if $C_4F_8$ is used as the fluorocarbon gas, the fluorine type resin film having smallest relative dielectric constant and excellent heat resistance can be obtained. The more the molecular weight, the more excellent the fluorine type resin film becomes.

Figure 31:
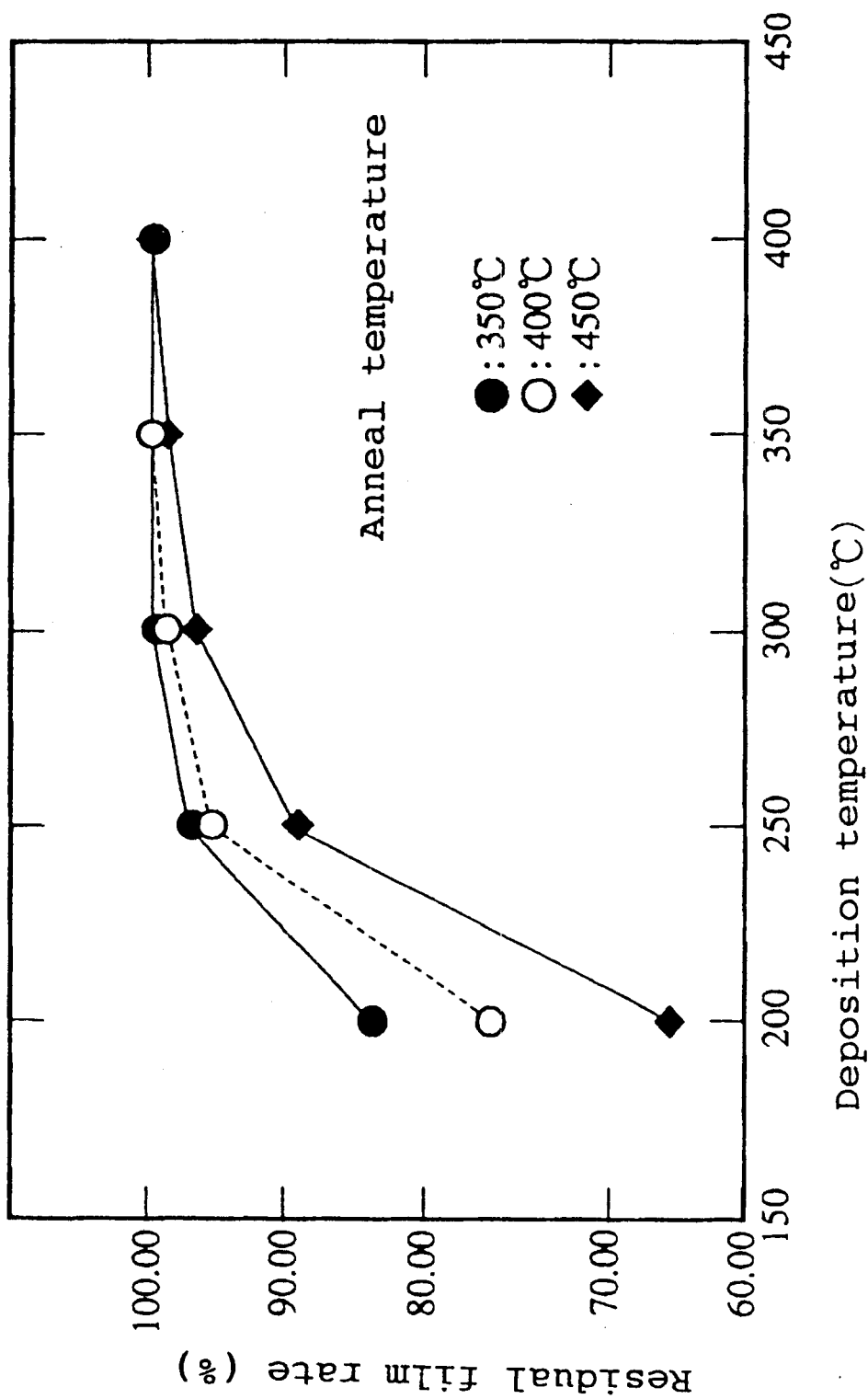
FIG. 31 is a characteristic view showing a dependency of a residual film rate of a fluorine type resin film upon a film forming temperature according to the fifth embodiment of the present invention.

FIG. 31 shows a dependency of a residual film rate of a fluorine type resin film upon a film forming temperature. In the film forming conditions, $C_2H_2$ is used as the hydrogen containing compound gas and $C_4F_8$ is used as the fluorocarbon gas. $C_4F_8$ is set to 60 sccm so as to provide the flow rate $C_2H_2:C_4F_8=1:7$, the pressure for forming the film is 1.2 Torr, and the applied power is 0.59 W/cm$^2$. Under the above conditions, the film has been formed by the CCP-plasma CVD method.

The residual film rate denotes a change in the film thickness of the fluorine type resin film in percentage before and after the film is annealed at 350° C., 400° C. and 450° C. of the film temperature for ten minutes in a nitrogen atmosphere of normal pressure. As can be seen from FIG. 31, the residual film rate is lowered if the annealing temperature is raised. On the other hand, the residual film rate is enhanced if the film forming temperature is raised. For instance, when the film is formed at 400° C., the good heat resistance to withstand 450° C. annealing can be achieved.

It can also be found that the fluorine type resin film formed at 350° C. may provides the heat resistance up to 400° C. If the film is formed at the substrate temperature of at least more than 250° C., the heat resistance superior to the conventional one can be realized. If higher heat resistance is required according to kinds of semiconductor devices, a proper film forming temperature may be selected on the basis of the tendency shown in FIG. 31 when the film is being formed.

From the aforementioned, in contrast to the conventional $CF_4$ or $C_2F_6$ having the small C/F ratio, by using fluorocarbon having the C/F ratio of 1/2 as the fluorocarbon gas in forming the film, the fluorine type resin film can be obtained which has low relative dielectric constant of less than 2.5, high bridging density because of being carbon rich, residual film rate of about 100% after annealing process at 300° C. or more, and excellent heat resistance.

Particularly, $C_4F_8$ with large molecular weight is most suitable for the fluorocarbon gas, and $C_2H_2$ is most suitable for the hydrogen containing compound gas under total consideration of various conditions. $C_3H_8$ is nextly suitable for the hydrogen containing compound gas. In addition, since the fluorine type resin film is formed at the film forming temperature of more than 250° C. IN the present invention, the relative dielectric constant seldom changes after annealing process in contrast to the conventional case where the film is formed at 50° C.

It should be noted that only film forming processes and the results have been explained in the descriptions in connection with FIGS. 22 to 30, but, if being applied to actual semiconductor devices, as shown in FIG. 22, the fluorine type resin film 4 should be formed by the plasma CVD method in the mixed atmosphere of the fluorocarbon gas having the C/F ratio of 1/2 and the hydrogen containing compound gas to form an interlayer insulating film after the interconnection layers 3 are formed. If being applied to the multilayered wiring structure, forming steps of the interconnection layers and the fluorine type resin film should be repeated alternatively.

In this case, even if distances between interconnection layers become short in the same layer hierarchy according to improvement of integration density, parasitic capacitance can be reduced, while keeping the good heat resistance, by employing as the interlayer insulating film the fluorine type resin film having the relative dielectric constant k=about 2.3, which being an almost half of the $SiO_2$ film obtained by the PCVD method. As a result, a wiring delay time may be reduced much more.

Although the CCP-plasma CVD method has been employed as the plasma CVD method in aforementioned embodiments, the plasma CVD method is not limited to such method. A High Density Plasma (HDP) scheme such as ICP (Inductive Coupled Plasma)-plasma CVD method, Helicon Plasma-plasma CVD method, or ECR (Electron Cyclotron Resonance)-plasma CVD method may also be employed.

In this case, the CCP-plasma CVD method is suitable for forming a flat film all over a surface because it is easy to operate, while the HDP scheme is suitable for forming a film on the recess portion because it is excellent in step coverage.

What is claimed is:

1. A semiconductor device comprising an SiOF film having film density of 2.25 to 2.27 g/cm$^3$.

* * * * *